(12) United States Patent
Kawanishi et al.

(10) Patent No.: US 9,875,877 B2
(45) Date of Patent: *Jan. 23, 2018

(54) ELECTRON SCANNING MICROSCOPE AND IMAGE GENERATION METHOD

(71) Applicant: HITACHI HIGH-TECHNOLOGIES CORPORATION, Tokyo (JP)

(72) Inventors: Shinsuke Kawanishi, Tokyo (JP); Yuusuke Oominami, Tokyo (JP)

(73) Assignee: Hitachi High-Technologies Corporation, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/111,907

(22) PCT Filed: Feb. 10, 2015

(86) PCT No.: PCT/JP2015/053598
§ 371 (c)(1),
(2) Date: Jul. 15, 2016

(87) PCT Pub. No.: WO2015/129446
PCT Pub. Date: Sep. 3, 2015

(65) Prior Publication Data
US 2016/0343538 A1 Nov. 24, 2016

(30) Foreign Application Priority Data
Feb. 27, 2014 (JP) .................................. 2014-036137

(51) Int. Cl.
*G01N 23/00* (2006.01)
*H01J 37/18* (2006.01)
(Continued)

(52) U.S. Cl.
CPC ............. *H01J 37/18* (2013.01); *H01J 37/16* (2013.01); *H01J 37/28* (2013.01);
(Continued)

(58) Field of Classification Search
CPC ............. H01J 37/00; H01J 37/02; H01J 37/18
(Continued)

(56) References Cited

U.S. PATENT DOCUMENTS

| 5,949,076 A | * | 9/1999 | Ohtoshi | H01J 37/02 |
| | | | | 250/396 R |
| 8,933,400 B2 | * | 1/2015 | Ominami | H01J 37/16 |
| | | | | 250/306 |

(Continued)

FOREIGN PATENT DOCUMENTS

| CN | 102292790 A | 12/2011 |
| JP | 2012-221766 A | 11/2012 |

(Continued)

OTHER PUBLICATIONS

Jun-ichi Niitsuma et al., "Nanoprocessing of Diamond Using a Variable Pressure Scanning Electron Microscope", Japanese Journal of Applied Physics, 2006, vol. 45, No. 2, pp. L71-L73.

(Continued)

*Primary Examiner* — Jason McCormack
(74) *Attorney, Agent, or Firm* — Mattingly & Malur, PC

(57) ABSTRACT

In a scanning electron microscope, an atmospheric pressure space having a specimen arranged therein and a vacuum space arranged on a charged particle optical system side are isolated from each other using an isolation film that transmits charged particle beams. The scanning electron microscope has an electron optical lens barrel, a chassis, and an isolation film. The electron optical lens barrel radiates a primary electron beam onto a specimen. The chassis is directly bonded to the inside of the electron optical lens barrel and has an inside that turns into a lower vacuum state than the inside of the electron optical lens barrel at least during the radiation of the primary electron beam. The isolation film isolates a space in an atmospheric pressure atmosphere having a specimen mounted therein and the (Continued)

inside of the chassis in a lower vacuum state, and transmits the primary charged particle beam.

9 Claims, 11 Drawing Sheets

(51) Int. Cl.
*H01J 37/16* (2006.01)
*H01J 37/28* (2006.01)

(52) U.S. Cl.
CPC . *H01J 2237/022* (2013.01); *H01J 2237/0213* (2013.01); *H01J 2237/164* (2013.01); *H01J 2237/182* (2013.01); *H01J 2237/2605* (2013.01)

(58) Field of Classification Search
USPC ...... 250/306, 307, 311, 441.11, 492.1, 492.3
See application file for complete search history.

(56) References Cited

U.S. PATENT DOCUMENTS

| | | | |
|---|---|---|---|
| 9,543,111 B2* | 1/2017 | Ominami | H01J 37/18 |
| 2003/0168595 A1* | 9/2003 | Danilatos | H01J 37/301 |
| | | | 250/310 |
| 2010/0096549 A1* | 4/2010 | Nishiyama | G01N 23/2251 |
| | | | 250/307 |
| 2010/0243888 A1* | 9/2010 | Nishiyama | H01J 37/20 |
| | | | 250/307 |
| 2011/0168889 A1* | 7/2011 | Shachal | G01N 23/22 |
| | | | 250/307 |
| 2012/0019648 A1 | 1/2012 | Hoshino et al. | |
| 2014/0175278 A1 | 6/2014 | Ominami et al. | |
| 2015/0014530 A1 | 1/2015 | Ominami et al. | |
| 2015/0129763 A1 | 5/2015 | Ominami et al. | |

FOREIGN PATENT DOCUMENTS

| | | |
|---|---|---|
| JP | 2013-175377 A | 9/2013 |
| JP | 2013-225419 A | 10/2013 |

OTHER PUBLICATIONS

International Search Report of PCT/JP2015/053598 dated Apr. 28, 2015.

Chinese Office Action received in corresponding Chinese Application No. 201580005384.9 dated Feb. 15, 2017.

* cited by examiner

ELECTRON SCANNING MICROSCOPE AND IMAGE GENERATION METHOD

TECHNICAL FIELD

The present invention relates to a charged particle beam apparatus which enables observation in the atmosphere or a predetermined gas atmosphere with atmospheric pressure.

BACKGROUND ART

In order to observe a very small area on an object, a scanning electron microscope (SEM), transmission electron microscope (TEM) or the like is used. Generally, in these apparatuses, a chassis for arranging a specimen is vacuum-pumped to turn the specimen atmosphere into a vacuum state, and an image of the specimen is picked up. Since electron beams are scattered by gas molecules in the atmosphere or the like, it used to be considered preferable that the passage of electron beams is a vacuum. However, biological/chemical specimens, liquid specimens and the like are damaged or changed in state by a vacuum. Meanwhile, there has been a great need for observation of such specimens with an electron microscope and SEM apparatuses which enable observation of an observation target specimen under atmospheric pressure have been developed recently.

PTL 1 discloses a SEM apparatus which enables observation under atmospheric pressure. In this apparatus, in principle, an isolation film capable of transmitting electron beams is provided between an electron optical system and a specimen, thus separating a vacuum state and an atmospheric state from each other. This is different from an observation method for an environmental cell or the like, in that the specimen is brought near the isolation film and observed in a non-contact state. This method enables observation by maintaining the passage immediately before electron beams reach the isolation film, in a high vacuum state by the isolation film, thus preventing the electron beams from being scattered, and also by limiting the area where the scattering of electron beams occurs to a very short distance between the isolation film and the specimen.

Meanwhile, NPL 1 discloses a method of processing a diamond by casting electron beams in a low vacuum atmosphere. NPL 1 also mentions a method of removing nanopillars on a diamond substrate.

CITATION LIST

Patent Literature

PTL 1: JP-A-2012-221766

Non-Patent Literature

NPL 1: Jun-ichi NIITSUMA et. al., "Nanoprocessing of Diamond Using a Variable Pressure Scanning Electron Microscope", Japanese Journal of Applied Physics, 2006, vol. 45, No. 2, p. L71-L73.

SUMMARY OF INVENTION

Technical Problem

In a charged particle beam apparatus which enables observation under atmospheric pressure, an atmospheric pressure space where a specimen is arranged and a vacuum space on the charged particle optical system side is isolated from each other, using an isolation film which transmits charged particle beams. Because of the requirement of transmitting charged particle beams, the thickness of the isolation film is set to be very thin and therefore the isolation film is often damaged by the contact of the specimen or the like.

Also, an experiment by the inventors has confirmed that, in the case of observation with charged particle beams, even if the specimen does not contact the isolation film, there is a phenomenon that the isolation film is damaged when the isolation film is irradiated or continues to be irradiated with charged particle beams. Because of this phenomenon, there is a need to replace the isolation film at a certain frequency, other than when it is damaged by the contact of the specimen or the like. Therefore, the frequency of replacement of the isolation film increases and problems arise such as a reduction in convenience and an increase in running costs due to the replacement work.

The inventors have found out that contamination generated on the isolation film by the irradiation with charged particle beams is the cause of the damage of the isolation film by the irradiation of charged particle beams. That is, the inventors have found out that when contamination is attached to the isolation film, the possibility of the isolation film being broken is increased by stress concentration at the boundary with the contamination-attached part or by thermal stress due to the difference in coefficient of thermal expansion between the isolation film and the contaminated part, or the like.

An object of the invention is to provide a charged particle beam apparatus in which the contamination generated on the isolation film is reduced, thus reducing the frequency of damage of the isolation film and achieving convenience with low running costs.

Solution to Problem

In order to solve the foregoing problem, a scanning electron microscope according to the invention includes: an electron optical lens barrel which irradiates a specimen with a primary charged particle beam; a chassis which is directly bonded to an inside of the electron optical lens barrel and has an inside turning into a lower vacuum state than the inside of the electron optical lens barrel at least during the irradiation with the primary electron beam; and an isolation film which isolates a space of an atmospheric pressure atmosphere where a specimen is placed and the inside of the chassis in a lower vacuum state, from each other, and transmits the primary charged particle beam.

According to an experiment by the inventors, it has been learned that contamination attached to the isolation film can be decomposed if the space inside the chassis in contact with the vacuum-side surface of the isolation film is turned into a low vacuum, that is, in the state where gas is left. This phenomenon is considered to be based on that, as gas molecules inside the chassis are irradiated with the primary charged particle beam, the gas molecules thus turned into plasma decompose the contamination attached to the isolation film.

Advantageous Effects of Invention

According to the invention, in the scanning electron microscope which enables observation under atmospheric pressure, the contamination attached to the isolation film is decomposed or removed, thus enabling a reduction in the probability of damage of the isolation film. Thus, a scanning electron microscope in which the frequency of replacement of the isolation film is reduced and in which convenience is achieved with low running costs can be provided.

Problems, configurations and advantageous effects other than those described above will be clarified in the following description of embodiments.

DESCRIPTION OF EMBODIMENTS

Each embodiment will be described below, using the drawings.

Hereinafter, as an example of a charged particle beam apparatus, a charged particle beam microscope will be described. However, this is simply an example of the invention, and the invention is not limited to the embodiments described below. The invention is also applicable to a scanning electron microscope, scanning ion microscope, scanning transmission electron microscope, combined apparatus of these and a specimen processing device, or an analysis/inspection device applying these.

Also, "atmospheric pressure" in this description means an atmospheric atmosphere or predetermined gas atmosphere which has a pressure environment in an atmospheric pressure or slightly negative pressure state. Specifically, the pressure is about $10^5$ Pa (atmospheric pressure) to approximately $10^3$ Pa. This pressure range may also be referred to as "non-vacuum".

Example 1

Figure 1:
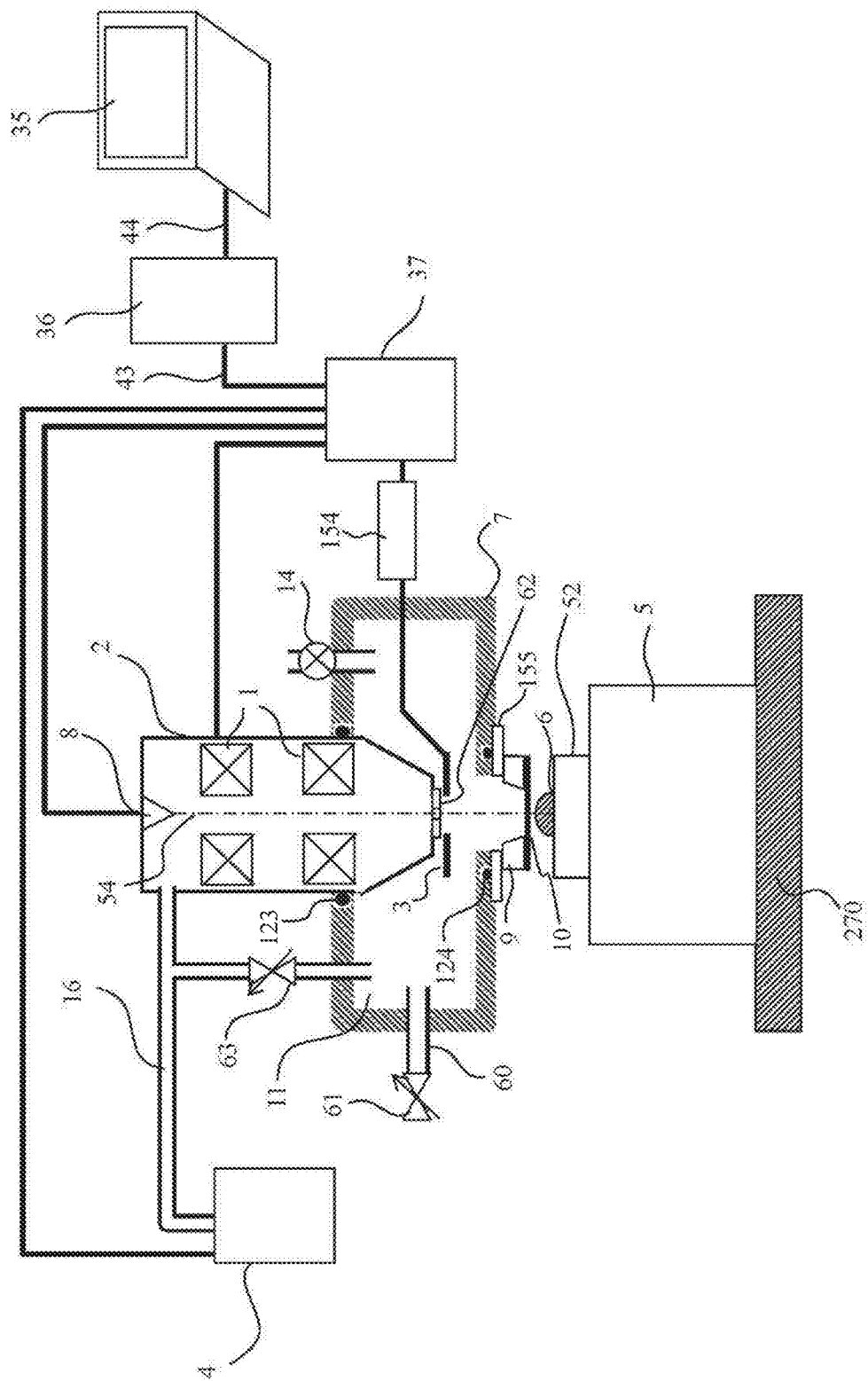
FIG. 1 is a view of the overall configuration of a charged particle microscope according to Example 1.

In this example, a basic embodiment will be described. FIG. 1 shows a view of the overall configuration of the charged particle microscope in this example. While the example below is described on the assumption of a scanning electron microscope, the invention is not limited to this, as described above.

The charged particle microscope shown in FIG. 1 is mainly made up of an charged particle optical lens barrel 2, a chassis (vacuum chamber) 7 which is connected to and supports the charged particle optical lens barrel 2, a specimen stage 5 arranged in an atmospheric atmosphere, and a control system which controls these. When the charged particle microscope is in use, the insides of the charged particle optical lens barrel 2 and the chassis 7 are vacuum-pumped by a vacuum pump 4. Start and stop operations of the vacuum pump 4 are controlled by the control system as well. Although only one vacuum pump 4 is shown in the illustration, there may be two or more vacuum pumps. It is assumed that the charged particle optical lens barrel 2 and the chassis 7 have pillars or the like, not shown, supported by a base 270.

The charged particle optical lens barrel 2 is made up of components such as a charged particle source 8 which generates charged particle beams, and an optical lens 1 which converges and guides the generated charged particle beams to the bottom part of the lens barrel and scans a specimen 6 with these beams as a primary charged particle beam. Due to problems such as the life of the charged particle source, generally, the atmosphere around the charged particle source has a pressure equal to or below $10^{-1}$ Pa (hereinafter referred to as high vacuum). The charged particle optical lens barrel 2 is installed in such a way as to protrude into the chassis 7 and is fixed to the chassis 7 via a vacuum sealing member 123. At the end of the charged particle optical lens barrel 2, a detector 3 which detects secondary charged particles (secondary electrons or reflected electrons) resulting from the irradiation with the primary charged particle beam is arranged. An image of the specimen is acquired on the basis of a signal obtained by the detector 3. The detector 3 may be situated outside or inside the charged particle optical lens barrel 2. The charged particle optical lens barrel may include other lenses, electrodes or detectors in addition to these, and a part of charged particle optical lens barrel may be different from the above. The configuration of the charged particle optical system included in the charged particle optical lens barrel is not limited to this.

The charged particle microscope in this example has, as its control system, a computer 35 used by the apparatus user, a higher-level controller 36 which is connected to and communicates with the computer 35, and a lower-level controller 37 which controls the vacuum pumping system, the charged particle optical system and the like according to commands transmitted from the higher-level controller 36. The computer 35 has a monitor where an operation screen (GUI) of the apparatus is displayed, and input units to the operation screen, such as keyboard and mouse. The higher-level controller 36, the lower-level controller 37 and the computer 35 are connected via communication lines 43, 44, respectively.

The lower-level controller 37 is a portion which transmits and receives control signals for controlling the vacuum pump 4, the charged particle source 8, and the optical lens 1 or the like, and also converts an output signal from the detector 3 into a digital image signal and transmits the digital image signal to the higher-level controller 36. In the illustration, the output signal from the detector 3 is connected to the lower-level controller 37 via an amplifier 154 such as preamplifier. The amplifier may be omitted if it is unnecessary.

The higher-level controller 36 and the lower-level controller 37 may include an analog circuit along with a digital circuit or the like. Also, the higher-level controller 36 and the lower-level controller 37 may be integrated into one unit. In addition to these, the charged particle microscope may also include a controller which controls operations of each part. The higher-level controller 36 and the lower-level controller 37 may be configured as hardware by a dedicated circuit board, or may be configured as software executed by the computer 35. The configuration as hardware can be realized by integrating a plurality of arithmetic units which executes processing, on a wiring board, or in a semiconductor chip or package. The configuration as software can be realized by installing a high-speed general-purpose CPU in the computer and executing a program that executes desired arithmetic processing. Also, the configuration of the control system shown in FIG. 1 is only an example. Modifications of the control unit, valve, vacuum pump or wiring for communication and the like fall within the scope of the SEM or charged particle beam apparatus in this example as long as the intended functions in this example are achieved.

Figure 2:
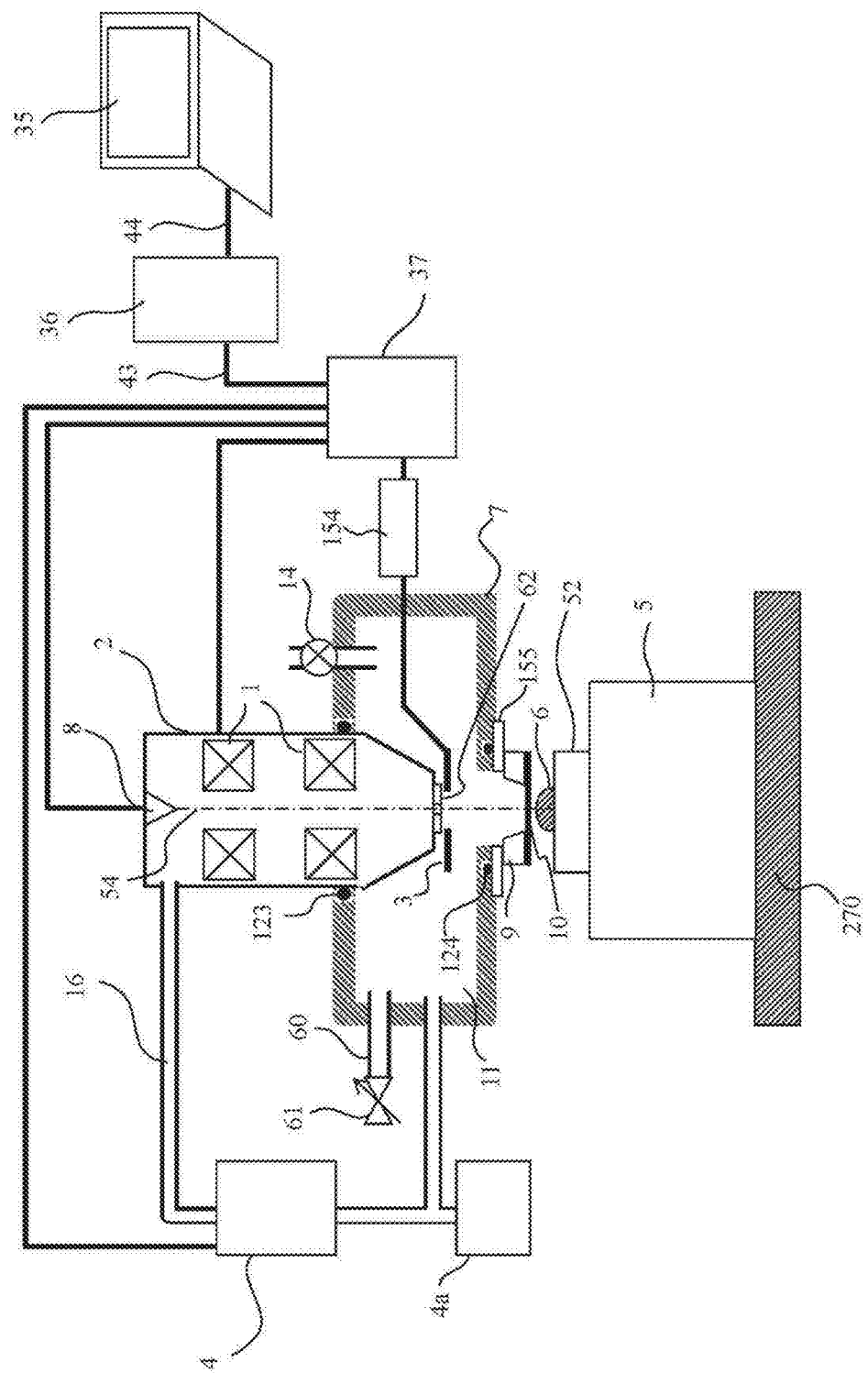
FIG. 2 is a view of the overall configuration of a modification of FIG. 1.

A vacuum pipe 16 having one end connected to the vacuum pump 4 is connected to the chassis 7, and therefore the inside of the chassis 7 can be maintained in a vacuum state. At the same time, a leak valve 14 for opening the inside of the chassis to the atmosphere is provided, and therefore the inside of the chassis 7 can be opened to the atmosphere at the time of maintenance or the like. The leak valve 14 may be omitted, or two or more leak valves may be provided. Also, the arrangement position of the leak valve 14 in the chassis 7 is not limited to the place shown in FIG. 1. The leak valve 14 may be arranged at a different position on the chassis 7. These configurations enable free adjustment of the degree of vacuum inside the chassis 7. However, the atmosphere around the charged particle source 8 needs to be maintained in a high vacuum, as described above. Thus, an orifice 62 for holding the pressure difference between the inside of the charged particle optical lens barrel 2 and the inside of the chassis 7 is provided. The orifice 62 is provided inside or directly below the charged particle optical lens barrel 2. Moreover, a flow rate adjusting unit for adjusting the exhaust flow rate may be provided in the vacuum pipe 16. The flow rate adjusting unit is an orifice or needle valve or the like, for example. As an example, the illustration shows a configuration in which the orifice 62 is provided directly below the charged particle optical lens barrel 2 and in which a needle valve 63 is provided in the vacuum pipe 16. This configuration is not limited to the above combination. For instance, with the orifice 62 provided directly below the charged particle optical lens barrel 2, a vacuum pump may be provided in each of the part of the charged particle optical lens barrel 2 and the part of the chassis 7. FIG. 2 shows an example in which the charged particle optical lens barrel 2 is vacuum-pumped by the vacuum pump 4 and in which the inside of the chassis 7 is vacuum-pumped by a second vacuum pump 4a, which is another pump. As shown in FIG. 2, the second vacuum pump 4a may have a two-stage exhaust configuration by being connected not only to the chassis 7 but also to the exhaust part of the vacuum pump 4. In this case, the gas inside the charged particle optical lens barrel 2 can be exhausted efficiently. As another example, with a single pump of a split flow system or the like, the part of the charged particle optical lens barrel 2 and the part of the chassis 7 may be set to different degrees of vacuum. As described above, by vacuum-pumping the inside of the charged particle optical lens barrel 2 and the inside of the chassis 7 or by limiting the exhaust flow rate thereof, the degree of vacuum in the charged particle optical lens barrel 2 can be made higher than that inside the chassis 7. Thus, the peripheries of an isolation film 10 inside the chassis 7 can be set in a lower vacuum while good apparatus performance such as resolution is maintained.

On the underside of the chassis, the isolation film 10 is provided at a position that comes directly below the charged particle optical lens barrel 2. This isolation film 10 can transmit or pass the primary charged particle beam emitted from the bottom end of the charged particle optical lens barrel 2, and the primary charged particle beam passes through the isolation film 10 and ultimately reaches the specimen 6 mounted on a specimen platform 52. The closed space formed and isolated from the specimen placement space by the isolation film 10 (that is, the inside of the charged particle optical lens barrel 2 and the chassis 7) can be vacuum-pumped. In this example, since the airtight state of the vacuum-pumped space is maintained by the isolation film 10, the charged particle optical lens barrel 2 can be maintained in a vacuum state, and the specimen 6 can be observed with the atmosphere around the specimen 6 maintained at atmospheric pressure. Also, since the space where the specimen is placed is the atmospheric atmosphere or communicates with the space with the atmospheric atmosphere even in the state where charged particle beams are cast, the specimen 6 can be freely replaced during observation.

The isolation film 10 is deposited or vapor-deposited on a foundation 9. The isolation film 10 is a carbon material, organic material, metal material, silicon nitride, silicon carbide, silicon oxide or the like. The foundation 9 is a member such as silicon or metal member, for example. The part of the isolation film 10 may be multiple windows arranged in a plural number. The thickness of the isolation film that can transmit or pass the primary charged particle beam is approximately several nm to several µm. It is necessary that the isolation film should not be damaged under the pressure difference for separating the atmospheric pressure and the vacuum. Therefore, the area of the isolation film 10 is approximately the size of several ten µm to several mm at the maximum.

The foundation 9 supporting the isolation film 10 is provided on an isolation film holding member 155. Although not illustrated, the foundation 9 and the isolation film holding member 155 are bonded together with an O-ring, packing, adhesive, double-sided adhesive tape or the like which enables vacuum sealing. The isolation film holding member 155 is removably fixed to the underside of the chassis 7 via a vacuum sealing member 124. The isolation film 10 has a very thin thickness of several nm to approximately several µm or below because of the requirement of transmitting charged particle beams and therefore may be damaged due to deterioration with time or in preparation for observation. Also, since the isolation film 10 and the foundation 9 supporting the isolation film are small, it is very difficult to directly handle these parts. Therefore, as in this example, by integrating the isolation film 10 and the foundation 9 with the isolation film holding member 155 so that the foundation 9 can be handled not directly but via the isolation film holding member 155, the handling (particularly replacement) of the isolation film 10 and the foundation 9 becomes easier. That is, when the isolation film 10 is damaged, the isolation film holding member 155 with the isolation film may be replaced. Even if the isolation film 10 must be directly replaced, the isolation film holding member 155 can be taken out of the apparatus, and the foundation 9 integrated with the isolation film 10 can be replaced outside the apparatus.

Also, though not illustrated, an optical microscope which enables observation of the specimen may be arranged directly below or near the specimen 6. In this case, the isolation film 10 is situated above the specimen, and the specimen is to be observed with the optical microscope from below. Therefore, in this case, the specimen platform 52 needs to be transparent to the light from the optical microscope. As a transparent member, a transparent glass, transparent plastic, transparent crystal or the like may be used. As a more common specimen platform, a transparent specimen platform such as microscope slide (or prepared slide) or dish (or petri dish) may be used.

Also, a temperature heater, a voltage application unit which can generate an electric field in the specimen, or the like, may be provided. In this case, it is possible to observe how the specimen is heated or cooled and how an electric field is applied to the specimen.

Also, two or more isolation films may be arranged. For example, an isolation film may be provided inside the charged particle optical lens barrel 2. Alternatively, a second isolation film may be provided below a first isolation film which separates the vacuum and the atmosphere, and the specimen may be contained between the second isolation film and the specimen stage.

Also, an environmental cell that can be introduced into the vacuum device, in the state where the entire specimen is contained therein, may be used as a specimen. For example, the invention described below is adaptable to the case where a specimen height adjustment mechanism is provided inside the environmental cell so as to bring the specimen closer to the isolation film for separating the vacuum and the atmosphere. In the invention, the number and type of the isolation film are not particularly limited, and any number and type fall within the scope of the SEM or charged particle beam apparatus in this example as long as the intended functions in this example are achieved.

When observing the specimen which is isolated in the atmospheric atmosphere by the isolation film, as the isolation film 10 is irradiated with charged particle beams with the inside of the chassis 7 being in a high vacuum state, hydrocarbon-based residual gas molecules near the isolation film 10 inside the chassis 7 are polymerized or cross-linked and fixed onto the isolation film 10. Foreign matters thus attached to the isolation film 10 are generally called contamination. Due to the contamination generated on the isolation film 10, apart or all of the primary charged particle beam or the secondary charged particle beam is shaded or scattered, thus obstructing the observation with charged particle beams.

Also, when the contamination is attached to the isolation film 10, the isolation film is broken by stress concentration at the boundary of the contamination-attached part or thermal stress due to the difference in coefficient of thermal expansion between the isolation film and the contaminated part, and the like. Since the contamination is generated on the isolation film 10 or the isolation film 10 is damaged by the generation of the contamination, there is a need to replace the isolation film 10 every predetermined period during which observation is carried out in the atmospheric pressure atmosphere. Thus, the problem of a reduction in apparatus convenience arises due to the complexity of the replacement work of the isolation film 10 or due to a reduction in the apparatus operating time caused by the replacement work of the isolation film 10. In addition, the problem of an increase in apparatus running costs due to the replacement of the isolation film 10 arises as well.

The inventors have found out that the above contamination can be reduced by the degree of vacuum in the space in contact with the isolation film. Thus, in the charged particle beam apparatus in this example, the inside of the chassis 7 is turned into a low vacuum. That is, while the inside of the charged particle optical lens barrel 2 is maintained in a high vacuum, the inside of the chassis 7 is turned into a low vacuum, thus setting atmospheric pressure in the space where the specimen is placed. In this description, "low vacuum" means an atmospheric atmosphere or predetermined gas atmosphere with an air pressure range of about 0.1 Pa or above and about 1000 Pa or below. If the pressure inside the chassis 7 is below about 0.1 Pa, the residual gas molecules are not turned into plasma by the irradiation with charged particle beams and therefore the contamination is hardly decomposed. Since the speed of attachment of the contamination is higher than the decomposition of the contamination as described above, this is not practical. Meanwhile, if the pressure inside the chassis 7 is above about 1000 Pa, the primary charged particle beam is scattered inside the chassis 7 and therefore cannot easily reach the specimen, making the resolution extremely low. Thus, in this example, as an air pressure range that enables efficient decomposition of the contamination, the inside of the chassis 7 is kept in the above range.

In the conventional apparatus for observing a specimen in an atmospheric pressure atmosphere, the space of the atmospheric pressure atmosphere and the vacuum space inside the charged particle optical lens barrel are isolated from each other by the isolation film. Since charged particle beams are scattered by the isolation film and gas molecules in the atmospheric pressure atmosphere, image quality is poorer than in the case of observing a specimen in a high vacuum. In order to improve image quality even a little, it is desired that the primary charged particle beam is scattered as little as possible in the passage up to where the primary charged particle beam reaches the isolation film. Therefore, conventionally, it is not assumed that the degree of vacuum in the passage up to where the primary charged particle beam reaches the isolation film is lowered. Also, generally, the primary charged particle beam passed through the objective lens is expected to reach the specimen without being subject to any subsequent influence. Also in this respect, it is not assumed in the conventional apparatus that the primary charged particle beam is deliberately scattered in the passage following the objective lens. In contrast, in this example, the inside of the chassis 7, which is the space between the objective lens and the isolation film, is turned into a low vacuum state within the above range of degree of vacuum and is irradiated with the primary charged particle beam, thus enabling decomposition of the contamination attached to the surface of the isolation film in contact with the inside of the chassis 7.

Also, since the inside of the charged particle optical lens barrel 2 is generally a high vacuum, it is necessary to maintain the pressure difference between the inside of the chassis 7 and the inside of the charged particle optical lens barrel. Therefore, to put it another way, it can be said that the "low vacuum" is a state where the air pressure is higher than inside the charged particle optical lens barrel. In the case where chambers with a plurality of different air pressures are provided inside the charged particle optical lens barrel, the inside of the chassis 7 is made a lower vacuum than the chamber with the lowest degree of vacuum (generally, the side where the primary charged particle beam is emitted), of these chambers. Also, to put it another way, it can be said that the chassis 7 is a low vacuum chamber provided between the high-vacuum charged particle optical lens barrel and the specimen chamber with atmospheric pressure. The primary charged particle beam generated by the charged particle source passes through the inside of the high-vacuum charged particle optical lens barrel, then passes through the inside of the chassis 7 in a low vacuum state, is subsequently transmitted through the isolation film, and is ultimately cast onto the specimen in the atmospheric pressure atmosphere. This low vacuum chamber is provided in order to turn the pressure on the surface in contact with one side of the isolation film, into a low vacuum, and the size of its internal space is not particularly defined.

The chassis 7 has an inlet port 60 for introducing the atmosphere or an arbitrary gas into the chassis 7. The inlet port 60 has a needle valve 61 connected thereto and therefore can adjust the flow rate at which the atmosphere or an arbitrary gas is introduced. Alternatively, a filter or orifice with high inflow resistance may be provided instead of the needle valve 61. With these flow rate adjusting units, the flow rate of gas introduction is properly regulated. The air pressure inside the chassis 7 can be increased by the gas introduced from the inlet port 60.

As the inside of the chassis 7 is turned into a low vacuum, that is, in the state where a gas is left, by the gas introduced from the inlet port 60, the gas molecules are irradiated with the primary electron beam or the secondary electron beam, and electrons and the gas molecules collide with each other, thus causing the gas molecules to ionize and turn into plasma. It is thought that, at this point, the hydrocarbon-based contamination is decomposed by sputtering with the ionized gas molecules. That is, the contamination can be decomposed by electron beam irradiation. Also, the speed of this decomposition depends on the amount of gas molecules in the surroundings, that is, the degree of vacuum. In a certain range of degree of vacuum, the speed at which the contamination is decomposed is higher than the speed at which the residual gas molecules are polymerized or cross-linked and attached onto the isolation film as the contamination as described above. Therefore, the generation of the contamination can be restrained.

The reduction of the contamination by setting a low vacuum on the peripheries of the isolation film 10 is as described above. Also, by setting a low vacuum on the peripheries of the isolation film 10, the pressure difference from the atmospheric pressure is decreased and the effect of reducing the pressure applied to the isolation film is expected as well. Thus, the stress generated on the isolation film 10 by the atmospheric pressure is decreased and the frequency of damage to the isolation film can be lowered. However, if the air pressure in the vacuum atmosphere is raised from 0.01 Pa to 0.1 Pa in order to reduce the pressure difference, for example, the pressure applied to the isolation film by the atmospheric pressure (100 kPa) is only reduced by $0.9 \times 10^{-5}\%$ and the isolation film damage prevention effect of the reduction in pressure difference is small. That is, the contamination reduction effect on the isolation film 10 is more effective for prevention of damage to the isolation film 10, than the pressure difference reduction effect of the setting of a low vacuum on the peripheries of the isolation film 10. Therefore, it is important to decompose the contamination by irradiating the isolation film with charged particle beams in a low vacuum atmosphere as described above.

Figure 3:
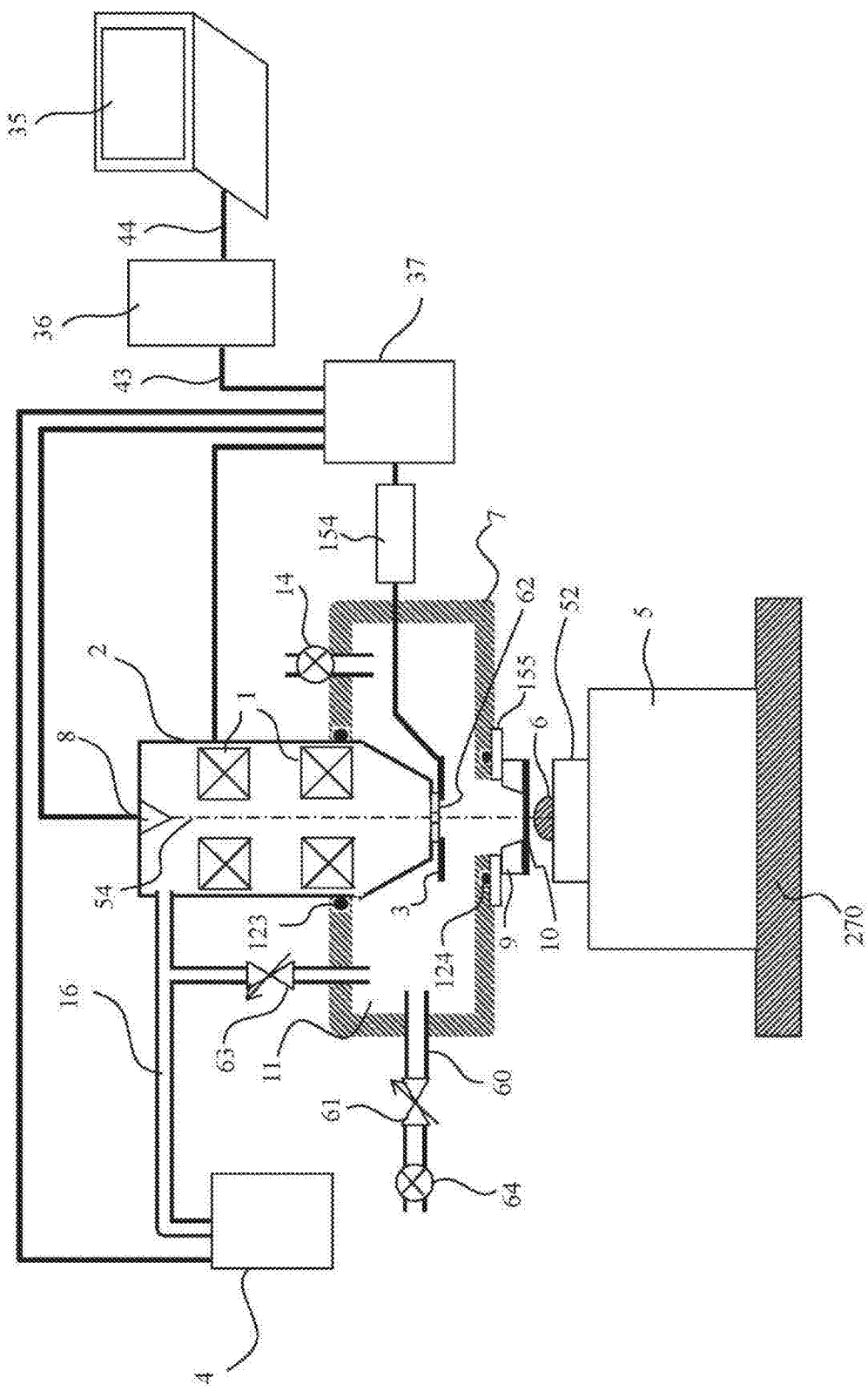
FIG. 3 is a view of the overall configuration of a modification of FIG. 1.

Also, as shown in FIG. 3, a valve 64 capable of open/close operations may be provided in the inlet port 60. Thus, the atmosphere inside the chassis 7 can be switched to an arbitrary degree of vacuum, of a high vacuum and a low vacuum. When the atmosphere inside the chassis 7 is a low vacuum, the primary charged particle beam can be scattered more easily than in the case of a high vacuum and therefore image quality deteriorates. Therefore, it is better to make the degree of vacuum inside the chassis 7 properly switchable.

For example, at the time of observation where there is no need for high image quality observation such as so-called field-of-view search to decide the observation target position of the specimen, a low vacuum is set inside the chassis 7 so as to restrain contamination on the isolation film 10, and when picking up an image, a high vacuum is set inside the chassis 7, thus restraining the scattering of the primary or secondary electron beam due to the residual gas molecules, and acquiring an image of high image quality with a good S/N ratio. Thus, it is possible to acquire an image of high image quality while preventing damage of the isolation film 10 due to the contamination. Also, a field-of-view search mode and an image pickup mode may be provided and an interface which enables the user to give an instruction to select from these modes may be shown on the display of the compute 35. In response to the user's instruction, the controllers 36, 37 control the flow rate adjusting unit such as the needle valve 61 to adjust the degree of vacuum inside the chassis 7. As a matter of course, the user him/herself may directly adjust the flow rate adjusting unit and thus adjust the degree of vacuum inside the chassis 7, without using the computer 35 and the controllers.

As another example, a unit for monitoring contamination on the isolation film 10 may be provided and the timing of decomposing the contamination may be thus decided. The generation of contamination may be monitored by image recognition or the like. However, the time until contamination accumulates on the isolation film 10 is decided by various conditions such as accelerating voltage and degree of vacuum, and is a substantially constant time for each charged particle beam apparatus. Therefore, the generation of contamination can be indirectly predicted from the cumulative sum of observation times under atmospheric pressure, and this may be used as the timing of decomposition of contamination. Specifically, the time until contamination accumulates on the isolation film. 10 and obstructs observation, or the time until the isolation film 10 is damaged, is stored in advance, and with a timer provided in the computer 35 or the like, the controllers 36, 37 control the flow rate adjusting unit such as the needle valve 61 to adjust the degree of vacuum inside the chassis 7 into a low vacuum, on a predetermined cycle. Thus, the operator can perform SEM observation under atmospheric pressure with convenience without worrying about the generation of contamination.

Also, an observation mode and a cleaning mode may be provided and an interface which enables the user to give an instruction to select from these modes may be shown on the display of the computer 35. In response to the user's instruction, the controllers 36, 37 control the flow rate adjusting unit such as the needle valve 61 to adjust the degree of vacuum inside the chassis 7. As a matter of course, the user him/herself may directly adjust the flow rate adjusting unit and thus adjust the degree of vacuum inside the chassis 7, without using the computer 35 and the controllers.

According to this, observation is carried out with a high vacuum inside the chassis 7, and when contamination on the isolation film 10 has increased, the inside of the chassis 7 is turned into a low vacuum and electron beam irradiation is performed. Thus, the contamination on the isolation film 10 can be decomposed. Also, by arbitrarily switching the degree of vacuum inside the chassis 7, it is possible to perform appropriate operations corresponding to the circumstances, such as restraining the contamination, acquiring an optimum SEM image, and decomposing the contamination.

Up to now, the configuration in which the degree of vacuum is made to be a low vacuum as a measure to reduce contamination has been described. It is also possible to remove contamination with other contamination reducing measures. However, the following problems arise and it cannot be said that these measures are practical, compared with the above-described reduction of contamination by charged particle beam irradiation in a low vacuum.

For example, the attachment of contamination to the isolation film can be reduced by providing a heater for heating the isolation film, on the peripheries of the isolation film 10. In this case, the isolation film 10 is very thin and has a large surface area in proportion to its volume. Therefore, even when the peripheries of the isolation film are heated, the heat is dissipated from the isolation film part and therefore it is difficult to sufficiently heat the central part of the isolation film. Alternatively, in the case where a member to be heat source is formed on the isolation film, the rise in running costs due to the price rise of the isolation film as an expendable product poses a problem. Also, it is possible to reduce contamination on the isolation film by providing, inside the chassis 7, a cooling member such as liquid nitrogen capable of cooling the inside more than the outside, and causing cooled cooling member as a cold trap to adsorb hydrocarbon-based gas. In this case, the cooling member needs to be arranged in the vicinity of the isolation film, that is, between the isolation film 10 and the charged particle optical lens barrel 2, and the isolation film 10 and the charged particle optical lens barrel 2 need to be sufficiently spaced apart from each other. Therefore, the distance between the isolation film 10 and the charged particle optical lens barrel 2 increases and the distance between the specimen 6 and the charged particle optical lens barrel 2 becomes longer, causing problems such as a reduction in the resolution of the image. Moreover, when liquid nitrogen is used for cooling, the rise in running costs poses a problem. Also, it is conceivable that a plasma generator is provided in the chassis 7 so that contamination is reduced or decomposed by plasma. In this case, the complication of the apparatus configuration due to the installation of the plasma generator is inevitable.

Based on these, setting a low vacuum inside the chassis 7 is simple, optimum and the most effective as a measure to prevent the generation of contamination on the isolation film 10.

Example 2

Incidentally, in the charged particle beam microscope which enables observation under atmospheric pressure, the observation field of view is limited by the opening area of the isolation film 10. That is, while the isolation film 10 is very thin because of the requirement of transmitting electron beams, the area of the isolation film 10 needs to be very small in order to seal the vacuum with the sufficiently thin isolation film. For example, the area of the isolation film 10 is 250 μm by 250 μm and the area of the isolation film 10 is set to be small enough to endure atmospheric pressure. Thus, observation is performed within the range of the opening area. Therefore, in order to observe a specific place on the specimen 6, the field of view is repeatedly moved to search for the observation target site. This operation is very complicated, significantly impairing the convenience of the charged particle beam microscope which enables observation under atmospheric pressure.

In this example, to cope with the above problem, an example will be described in which an optical microscope or the like is utilized for field-of-view search at the time of observation with the charged particle beam microscope, thereby improving the convenience of the charged particle beam microscope which enables observation in an atmospheric pressure atmosphere. Hereinafter, an apparatus configuration and a method of use will be described. The description of parts similar to those in Example 1 will be omitted for simplification.

Figure 4:
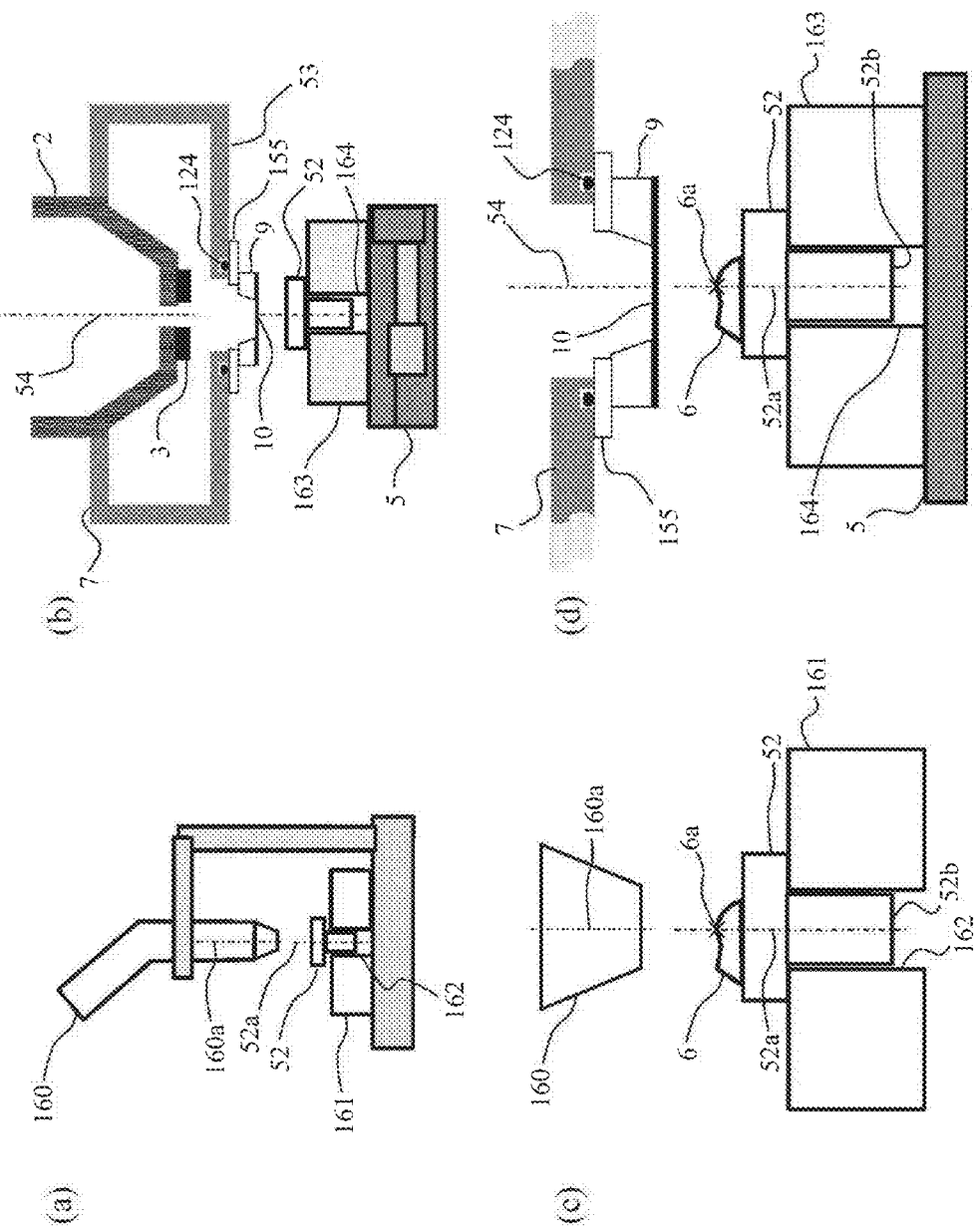
FIG. 4 is a view of the configuration in the case where an optical microscope is combined.

FIG. 4 shows a configuration in which an optical microscope is used for field-of-view search at the time of performing observation with the charged particle beam microscope. In this configuration, an apparatus which enables observation at a lower magnification in an atmospheric pressure atmosphere, such as an optical microscope or high-magnification camera, is used. As an example, a configuration using an optical microscope 160 will be described below.

The optical microscope 160 has a specimen mounting platform 161 capable of holding the specimen platform 52 in a predetermined positional relation with an optical microscope optical axis 160a (FIG. 4(a)). Similarly, a specimen mounting platform 163 is provided for the specimen stage 5 of a charged particle microscope 53 (FIG. 4(b)). The specimen mounting platform 163 can hold the specimen platform 52 in a predetermined positional relation with a charged particle beam optical axis 54 when the specimen stage 5 is positioned at predetermined coordinates. The positional relation between the optical microscope optical axis 160a and the specimen platform 52 when the specimen platform 52 is mounted on the specimen mounting platform 161, and the positional relation between the electron beam optical axis 54 and the specimen platform 52 when the specimen platform 52 is mounted on the specimen mounting platform 162 coincide with each other.

While the predetermined positional relation is mentioned above, a description is given here, using a configuration having the specimen mounting platform 161 where the optical microscope optical axis 160a and a center axis 52a of the specimen platform 52 coincide with each other, as an example.

The specimen mounting platform 161 has a positioning structure 162 in a shape paired with the specimen platform 52, such as a pin or hole. As the specimen platform 52 is fitted with the positioning structure 162, the center axis 52a of the specimen platform 52 and the optical microscope optical axis 160a can be held coincident with each other. On the specimen stage 5 of the charged particle beam microscope 53, too, a positioning structure 164 has a structure of the same shape as the positioning structure 162. Thus, the specimen platform 52 is held in such a way that the center axis 52a and the optical axis 54 of the electron beam coincide with each other when the specimen stage 5 is placed at a predetermined position. In the illustrated configurations, the positioning structures 162, 164 are holes and a pin 52b is provided on the specimen platform 52, as an example. However, other structures such as a groove and protrusion may also be used.

Thus, the observation field of view when the specimen platform 52 is observed with the optical microscope 160 and the observation field of view when the specimen platform 52 is observed with the charged particle beam microscope 53 coincide with each other. That is, in this configuration, the same specimen platform 52 corresponds to the positioning structure 162 in the optical microscope 160 and the positioning structure 164 in the charged particle beam microscope 53, thus enabling observation of the same field of view with the optical microscope 160 and the charged particle beam microscope 53. Hereinafter, advantageous effects of this configuration will be described on the basis of observation procedures.

First, the specimen platform 52 is mounted on the specimen mounting platform 161 of the optical microscope 160, and while observation is performed with the optical microscope 160, the specimen 6 is adjusted using a hand or tweezers in such a way that an observation target site 6a of the specimen 6 comes to the center of the field of view, and the specimen 6 is arranged or fixed onto the specimen platform 52 (FIG. 4(c)). Next, the specimen platform 52 is removed from the specimen mounting platform 161 of the optical microscope 160, and the specimen platform 52 is mounted on the specimen mounting platform 163 of the charged particle beam microscope 53. Then, as observation is started after the specimen stage 5 is moved to a predetermined position, the peripheries of the observation target site 6a of the specimen 6 can be observed (FIG. 4(d)).

As described above, by adjusting the position of the observation target site 6a of the specimen 6 during observation with the optical microscope 160, the observation target site 6a can be observed in an atmospheric pressure atmosphere with the charged particle beam microscope, without complicated field-of-view search work in the charged particle beam microscope 53. This improves the convenience of the field-of-view search operation in the charged particle beam microscope which enables observation in an atmospheric pressure atmosphere.

While the configuration having the specimen mounting platform 161 where the optical microscope optical axis 160a and the center axis 52a of the specimen platform 52 coincide with each other is described, it is needless to say that similar effects are achieved if the optical microscope optical axis 160a and the center axis 52a of the specimen platform 52 are held in a predetermined positional relation by the specimen mounting platform 161, as described above.

Next, another example of utilizing an optical microscope or the like for field-of-view search at the time of observation with a charged particle beam microscope will be described. In the foregoing example, since human hand or tweezers or the like is used to adjust the position of the specimen during the observation with the optical microscope 160, there is a problem of poor accuracy and convenience in detailed work such as fine tuning. Thus, an example in which a moving mechanism is provided on the specimen platform 52 so that position adjustment of the specimen is carried out by the moving mechanism will be described below.

Figure 5:
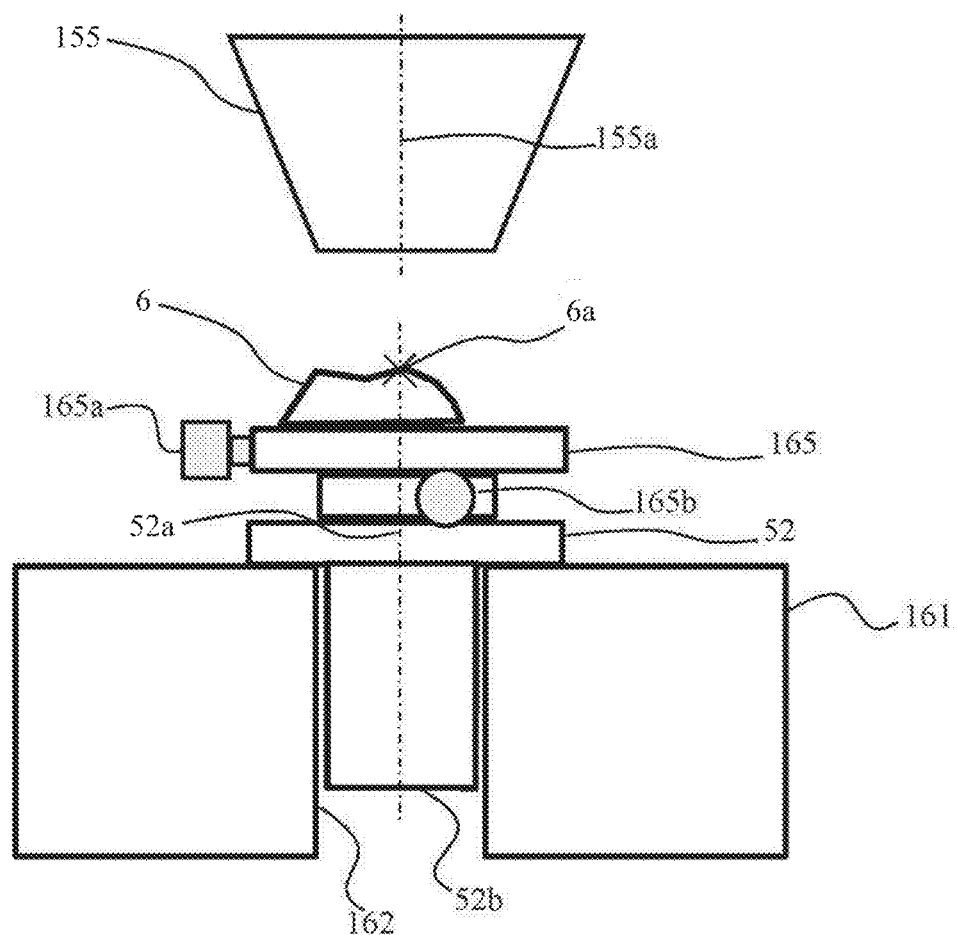
FIG. 5 is a view of details of a specimen platform.

FIG. 5 shows a configuration in which a moving mechanism is provided for the specimen platform 52. As the specimen platform in FIG. 5, the specimen platform 52 has a moving mechanism 165 capable of moving the specimen on a plane (hereinafter referred to as XY plane) perpendicular to the direction of the optical microscope optical axis 160a. The moving mechanism 165 has knobs 165a, 165b and freely movable in X and Y directions. By operating the knobs 165a, 165b to move the moving mechanism 165, during observation with the optical microscope 160, an arbitrary site on the specimen 6 can be observed and the observation target site 6a can be found and moved to the center of the field of view. After the observation target site 6a is adjusted to the center of the field of view of the optical microscope, as the specimen platform is mounted on the charged particle beam microscope 53 and the specimen stage 5 is set to a predetermined position similarly to the above, the observation target site can be observed. That is, even if the moving mechanism 165 above the specimen platform 52 is moved in the XY direction, the positional relation between the optical microscope optical axis 160a and the center axis 52a of the specimen platform is kept unchanged by the positioning structure 162. Thus, it is possible to decide and adjust the observation target site under the optical microscope 160 more easily. The operability of field-of-view search in the charged particle beam microscope which enables observation in an atmospheric pressure atmosphere can be significantly improved and further improvement of convenience can be achieved.

The configuration using the optical microscope 160 for positioning for observation with the charged particle beam microscope has been described. By using the above configuration, the effect of being able to easily compare an optical microscope image including color information and a charged particle beam image with higher resolution or including composition information can be realized as well.

Example 3

Figure 6:
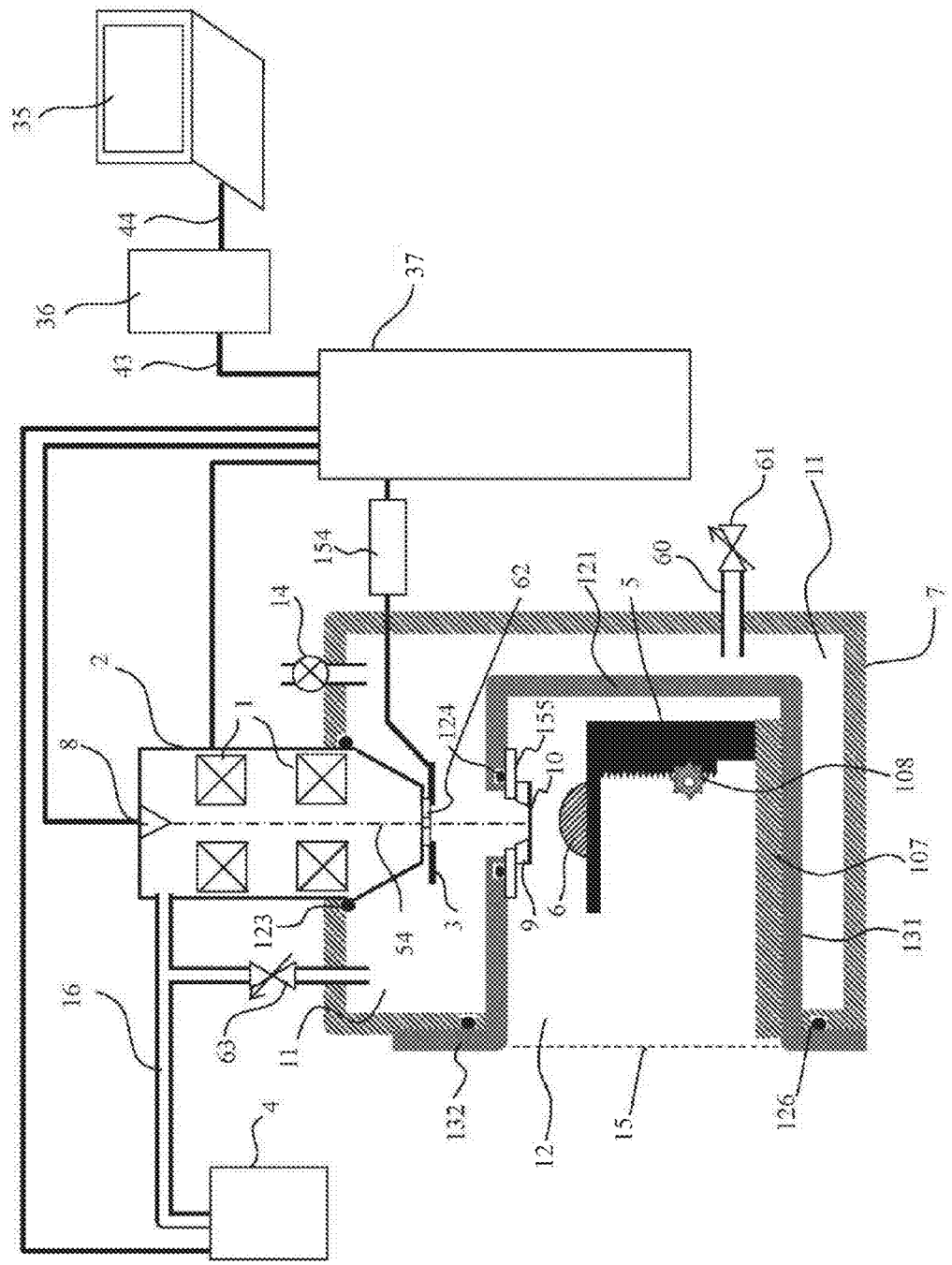
FIG. 6 is a view of the overall configuration of a charged particle microscope according to Example 3.

Hereinafter, an apparatus configuration with which a specimen can be observed easily using a common charged particle beam apparatus will be described. FIG. 6 shows a view of the overall configuration of the charged particle microscope in this example. As in Example 1, the charged particle microscope in this example, too, is made up of the charged particle optical lens barrel 2, the chassis (vacuum chamber) 7 supporting the charged particle optical lens barrel 2 to an apparatus installation surface, the specimen stage 5 and the like. The operations and functions of each of these components, or additional components added to each component are substantially similar to those in Example 1 and therefore the detailed description thereof is omitted.

The charged particle microscope shown in FIG. 6 has a second chassis (attachment) 121 inserted for use in the chassis 7 (hereinafter the first chassis). The second chassis 121 is made up of a main body part 131 in the shape of a rectangular parallelepiped and a joint part 132. As described below, at least one lateral side of the lateral sides of the rectangular parallelepiped shape of the main body part 131 is an open side 15. Of the lateral sides of the rectangular parallelepiped shape of the main body part 131, the sides other than the side where the isolation film holding member 155 is mounted may be formed by walls of the second chassis 121, or may be formed by sidewalls of the first chassis 7 in the state where the second chassis 121 itself has no walls and is incorporated in the first chassis 7. The second chassis 121 has its position fixed to a sidewall or inner wall of the first chassis 7 or to the charged particle optical lens barrel. The main body part 131 has the function of storing the specimen 6 as an observation target and is inserted into the first chassis 7 through the above opening. The joint part 132 forms a joint surface to the outer wall surface on the lateral side where the opening of the first chassis 7 is provided, and is fixed to the outer wall surface of on the lateral side via a vacuum sealing member 126. Thus, the entire second chassis 121 is fitted in the first chassis 7. The above opening can be manufactured most easily utilizing an opening for carrying a specimen in and out that is provided from the beginning in the vacuum specimen chamber of the charged particle microscope. That is, if the second chassis 121 is manufactured to match the size of the hole that is opened from the beginning, and the vacuum sealing member 126 is mounted around the hole, it only takes a minimum necessary modification of the apparatus. Also, the second chassis 121 can be removed from the first chassis 7.

The lateral side of the second chassis 121 is the open side 15 communicating to the atmospheric space through a face with a size large enough at least to put a specimen in and out. The specimen 6 stored inside of the second chassis 121 (to the right of the dotted line in the illustration; hereinafter referred to as second space) is placed in an atmospheric pressure state during observation. FIG. 6 is a cross-sectional view of the apparatus in a direction parallel to the optical axis and therefore illustrates the open side 15 only on one side. However, the open side 15 of the second chassis 121 is not limited to one side if vacuum sealing is provided by the lateral sides of the first chassis in the back direction and forward direction in the illustration of FIG. 6. It suffices that at least one side is an open side in the state where the second chassis 121 is incorporated in the first chassis 7. Meanwhile, the vacuum pump 4 is connected to the first chassis 7, thus enabling vacuum-pumping of a closed space (hereinafter referred to as first space) formed by the inner wall surface of the first chassis 7, the outer wall surface of the second chassis and the isolation film 10. Since the isolation film is arranged in such a way that the pressure in the second space is kept higher than the pressure in the first space, in this example, the second space can be isolated in terms of pressure. That is, a first space 11 is maintained in vacuum state by the isolation film 10, whereas a second space 12 is maintained in a gas atmosphere with atmospheric pressure or a pressure substantially equal to atmospheric pressure. Therefore, during the operation of the apparatus, the charged particle optical lens barrel 2 and the detector 3 can be maintained in a vacuum state and the specimen 6 can be maintained at atmospheric pressure. Also, since the second chassis 121 has the open side, the specimen 6 can be replaced freely during observation.

On the top surface side of the second chassis 121, the isolation film 10 is provided at a position that comes directly below the charged particle optical lens barrel 2 when the entire second chassis 121 is fitted in the first chassis 7. This isolation film 10 can transmit or pass a primary charged particle beam emitted from the bottom end of the charged particle optical lens barrel 2. The primary charged particle beam passes through the isolation film 10 and ultimately reaches the specimen 6.

The specimen stage 5 or the like is arranged inside the second chassis 121, thus enabling the specimen 6 to be moved freely.

This apparatus, too, has the inlet port 60 to turn the inside of the chassis 7 (that is, the first space 11) into a low vacuum, as in Example 1. The configuration related to the inlet port 60 is similar to that in Example 1 and therefore the detailed description thereof is omitted.

Example 4

Figure 7:
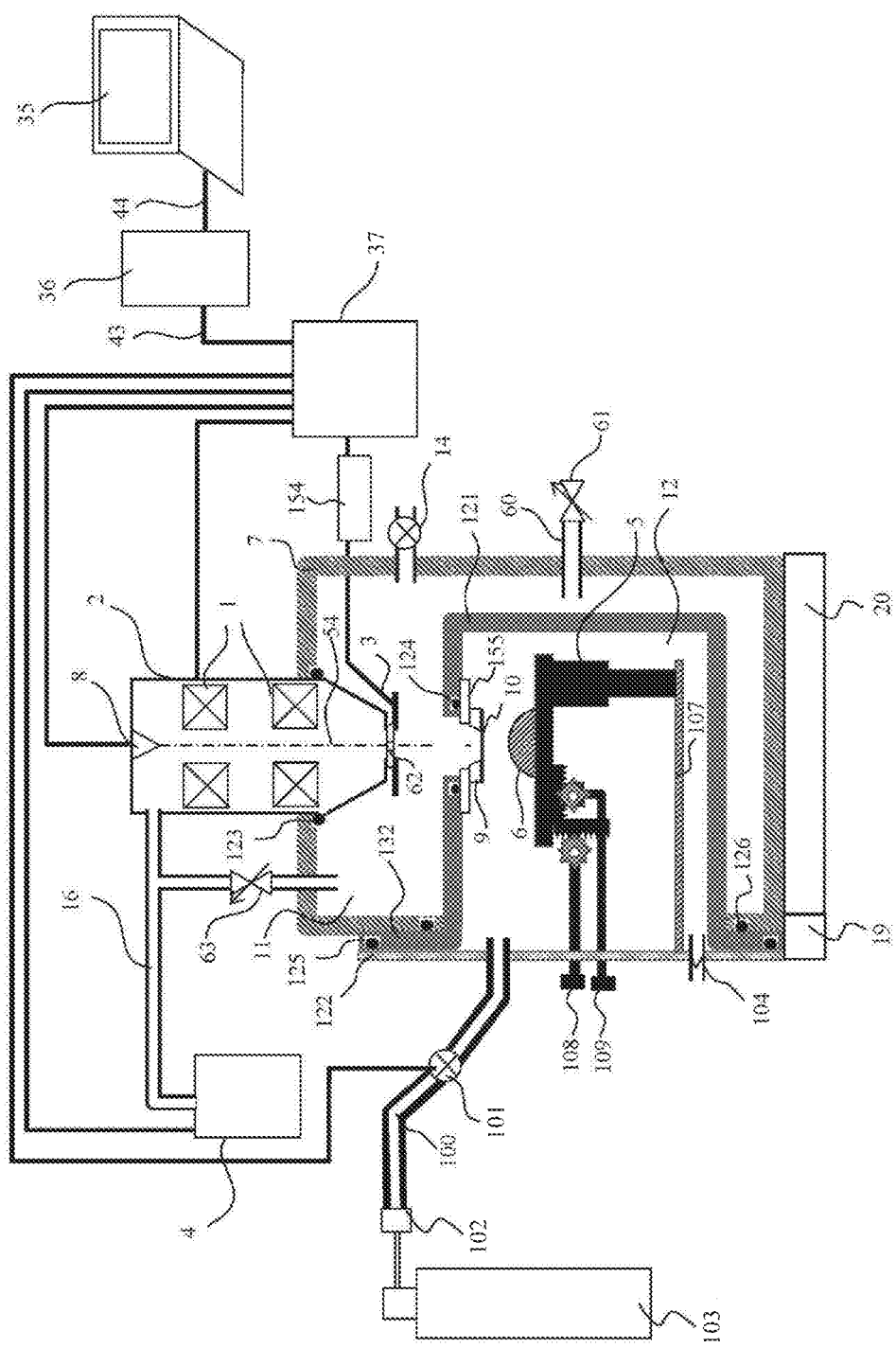
FIG. 7 is a view of the overall configuration of a charged particle microscope according to Example 4.

FIG. 7 shows a view of the overall configuration of a charged particle microscope in this example. This example is a modification of Example 3. The detailed description of parts similar to those in Examples 1 and 3 is omitted.

In the case of the charged particle microscope in this example, the open side forming at least one lateral side of the second chassis 121 can be covered by a cover member 122 and various functions can be realized. These will be described below.

<About Specimen Stage>

The charged particle microscope in this example has, on the cover member 122, the specimen stage 5 as a measure for changing the specimen position and thereby moving the observation field of view. The specimen stage 5 is provided with an XY drive mechanism for an in-plane direction and a Z-axis drive mechanism for a height direction. A support plate 107 as a bottom plate supporting the specimen stage 5 is attached to the cover member 122, and the specimen stage 5 is fixed to the support plate 107. The support plate 107 is attached in such a way as to be directed toward the surface facing the second chassis 121, of the cover member 122, and to extend toward the inside of the second chassis 121. Support shafts extend from the Z-axis drive mechanism and the XY drive mechanism, respectively, and are connected to an operation knob 108 and an operation knob 109, respectively, provided on the cover member 122. The user of the apparatus adjusts the position of the specimen 6 within the second chassis 121 by operating these operation knobs 108 and 109.

<About Atmosphere Around Specimen>

The charged particle microscope in this example has the function of supplying a replacement gas into the second chassis or the function of enabling formation of an air pressure state that is different from the first space 11 or the outside air outside the apparatus. Charged particle beams emitted from the bottom end of the charged particle optical lens barrel 2 pass through the first space maintained in a high vacuum and passes through the isolation film 10, and the specimen 6 is irradiated with the charged particle beams. In the atmospheric space, the charged particle beams are scattered by gas molecules and therefore the mean free path thereof becomes shorter. That is, if the distance between the isolation film 10 and the specimen 6 is long, the primary charged particle beam, or secondary electrons, reflected electrons, transmitted electrons or the like generated by charged particle beam irradiation cannot reach the specimen and the detector 3. Meanwhile, the probability of scattering of charged particle beams is proportional to the mass number and density of gas molecules. Therefore, by replacing the second space with gas molecules with a smaller mass number than the atmosphere or by slightly purging air from the second space, the probability of scattering of the charged particle beams falls, enabling the charged particle beams to reach the specimen. Also, it suffices that gas replacement or air purge can be carried out for the atmosphere at least in the passage of the charged particle beams in the second space, that is, in the space between the isolation film 10 and the specimen 6, instead of the entire second space.

For the foregoing reasons, in the charged particle microscope in this example, an attachment part (gas inlet part) for a gas supply pipe 100 is provided in the cover member 122. The gas supply pipe 100 is connected to a gas cylinder 103 by a connecting part 102. Thus, a replacement gas is introduced into the second space 12. A gas control valve 101 is arranged halfway in the gas supply pipe 100, thus enabling control of the flow rate of the replacement gas flowing through the pipe. Therefore, a signal line extends from the gas control valve 101 to the lower-level controller 37, and the user of the apparatus can control the flow rate of the replacement gas on an operation screen displayed on the monitor of the computer 35. Also, the gas control valve 101 may be manually operated to open and close.

As the type of the replacement gas, a lighter gas than the atmosphere, such as nitrogen or water vapor, exhibits an image S/N improvement effect. However, a helium gas or hydrogen gas, which has a smaller mass, achieves a greater image S/N improvement effect.

The replacement gas is a light-element gas and therefore tends to stay in the upper part of the second space 12 and cannot easily replace the gas on the lower side. Thus, with the cover member 122, an opening connecting the inside and outside of the second space is provided below the attachment position of the gas supply pipe 100. For example, in FIG. 8, an opening is provided at the attachment position of a pressure control valve 104. Thus, the atmospheric gas is pushed by the light-element gas introduced from the gas inlet part and is discharged from the opening on the lower side. Therefore, the gas inside the second chassis 121 can be replaced efficiently. This opening may be also be used as a rough exhaust port, described later.

The pressure control valve 104 may be provided instead of the above opening. The pressure control valve 104 has the function of automatically opening the valve when the internal pressure of the second chassis 121 reaches the standard atmospheric pressure or higher. By providing the pressure control valve having such a function, it is possible to discharge atmospheric gas components such as nitrogen and oxygen to the outside of the apparatus as the valve automatically opens when the internal pressure reaches the standard atmospheric pressure or higher at the time of introducing the light-element gas, and to fill the inside of the apparatus with the light-element gas. In some cases, the illustrated gas cylinder or vacuum pump 103 is installed in the charged particle microscope, whereas in other cases, the user of the apparatus installs the gas cylinder 103 as a follow-up operation.

Meanwhile, even the light-element gas such as helium gas or hydrogen gas can cause significant electron beam scattering in some cases. In such cases, a vacuum pump may be used as the gas cylinder 103. Then, by slighting purging air, it is possible to turn the inside of the second chassis into an ultra-low vacuum state (that is, an atmosphere with a pressure close to the atmospheric pressure). That is, it is possible to turn the space between the isolation film 10 and the specimen 6 into an ultra-low vacuum state. For example, a vacuum pumping port is provided in the second chassis 121 or the cover member 122, and the inside of the second chassis 121 is slightly vacuum-pumped. After that, the replacement gas may be introduced therein. In the vacuum pumping in this case, it suffices to be able to reduce the atmospheric gas components remaining inside the second chassis 121 to a predetermined amount or below. Therefore, there is no need to perform high vacuum pumping, and rough exhaust is enough.

In this way, in this example, the space where the specimen is placed can be controlled to an arbitrary degree of vacuum ranging from atmospheric pressure (about $10^5$ Pa) to about $10^3$ Pa. In the conventional so-called low-vacuum scanning electron microscope, since the electron beam column and the specimen chamber communicate with each other, if the degree of vacuum in the specimen chamber is lowered to a pressure close to atmospheric pressure, the pressure inside the electron beam column changes together and therefore it is difficult to control the specimen chamber to a pressure ranging from atmospheric pressure (about $10^5$ Pa) to $10^3$ Pa. According to this example, since the second space and the first space are isolated from each other by the thin film, the pressure and gas type of the atmosphere in the second space 12 surrounded by the second chassis 121 and the cover member 122 can be freely controlled. Therefore, the specimen chamber can be controlled to a pressure ranging from atmospheric pressure (about $10^5$ Pa) to $10^3$ Pa, which has conventionally been difficult. Moreover, it is possible not only to carry out observation under atmospheric pressure (about $10^5$ Pa) but also to observe the state of the specimen with the pressure in its vicinities changed continuously.

Also, though not illustrated, the part of the cylinder 103 may be a composite gas control unit or the like in which a gas cylinder and a vacuum pump are connected together as a composite.

The configuration according to this example is characterized in that the second space 12 inside the second chassis is closed, compared with the preceding configurations. Therefore, it is possible to provide a charged particle beam apparatus in which a gas can be introduced between the isolation film 10 and the specimen 6 or vacuum pumping can be performed there.

In this example, too, the inlet port 60 for turning the inside of the chassis 7 into a low vacuum is provided, as in Examples 1 and 3. In view of the reduction of contamination attached to the isolation film, it is important to turn the inside of the chassis 7 into a low vacuum, and the pressure inside the chassis 7 may be left constant instead of depending on the pressure in the second space 12.

Also, in this configuration, by removing the isolation film 10, it is possible to use the apparatus as a so-called common SEM with which not only observation in an atmospheric pressure atmosphere but also observation in a vacuum environment is carried out. That is, when the isolation film 10 is mounted, it is possible to carry out observation in an atmospheric pressure atmosphere, setting the inside of the first space to a low vacuum and reducing the contamination on the isolation film 10. When the isolation film 10 is removed, the inside of the first space and the inside of the second space 12 with the specimen 6 arranged therein are set to a high vacuum, thus enabling observation with higher resolution or higher magnification, as a common charged particle microscope.

<Others>

As described above, in this example, the specimen stage 5 and its operation knobs 108, 109, the gas supply pipe 100, and the pressure control valve 104 are all mounted on the cover member 122 in a concentrated manner. Therefore, the user of the apparatus can carry out operations of the operation knobs 108, 109, specimen replacement work, or operations of the gas supply pipe 100 and the pressure control valve 104, on the same surface of the first chassis. Thus, operability is significantly improved, compared with a charged particle microscope having a configuration in which the above components are mounted separately on other surfaces of the specimen chamber.

In addition to the above configuration, a contact monitor for detecting the contact state between the second chassis 121 and the cover member 122 may be provided, thus monitoring that the second space is closed or open.

Also, in addition to the secondary electron detector and the reflected electron detector, an X-ray detector and a photodetector may be provided, thus enabling EDS analysis and detection of fluorescent beams. As arrangement of the X-ray detector and the photodetector, these may be arranged in one of the first space 11 and the second space 12.

Thus, according to this example, a replacement gas can be introduced from atmospheric pressure, in addition to the advantageous effects of Examples 1 and 2. Also, the specimen can be observed in an atmosphere with a different pressure from that in the first space. Moreover, by removing the isolation film and allowing the first space and the second space to communicate with each other, a SEM which enables specimen observation in the same vacuum state as the first space, as well as observation in the atmosphere or in a predetermined gas atmosphere, is realized.

Example 5

In this example, an apparatus configuration and method for adjusting the specimen position inside a specimen storage container from outside a charged particle beam apparatus will be described. As in Examples 1 to 4, the charged particle microscope in this example is made up of the charged particle optical lens barrel 2, the chassis (vacuum chamber) 7 supporting the charged particle optical lens barrel 2 to an apparatus installation surface, the specimen stage 5 and the like. The operations and functions of each of these components, or additional components added to each component are substantially similar to those in Examples 1 to 3 and therefore the detailed description thereof is omitted.

Figure 8:
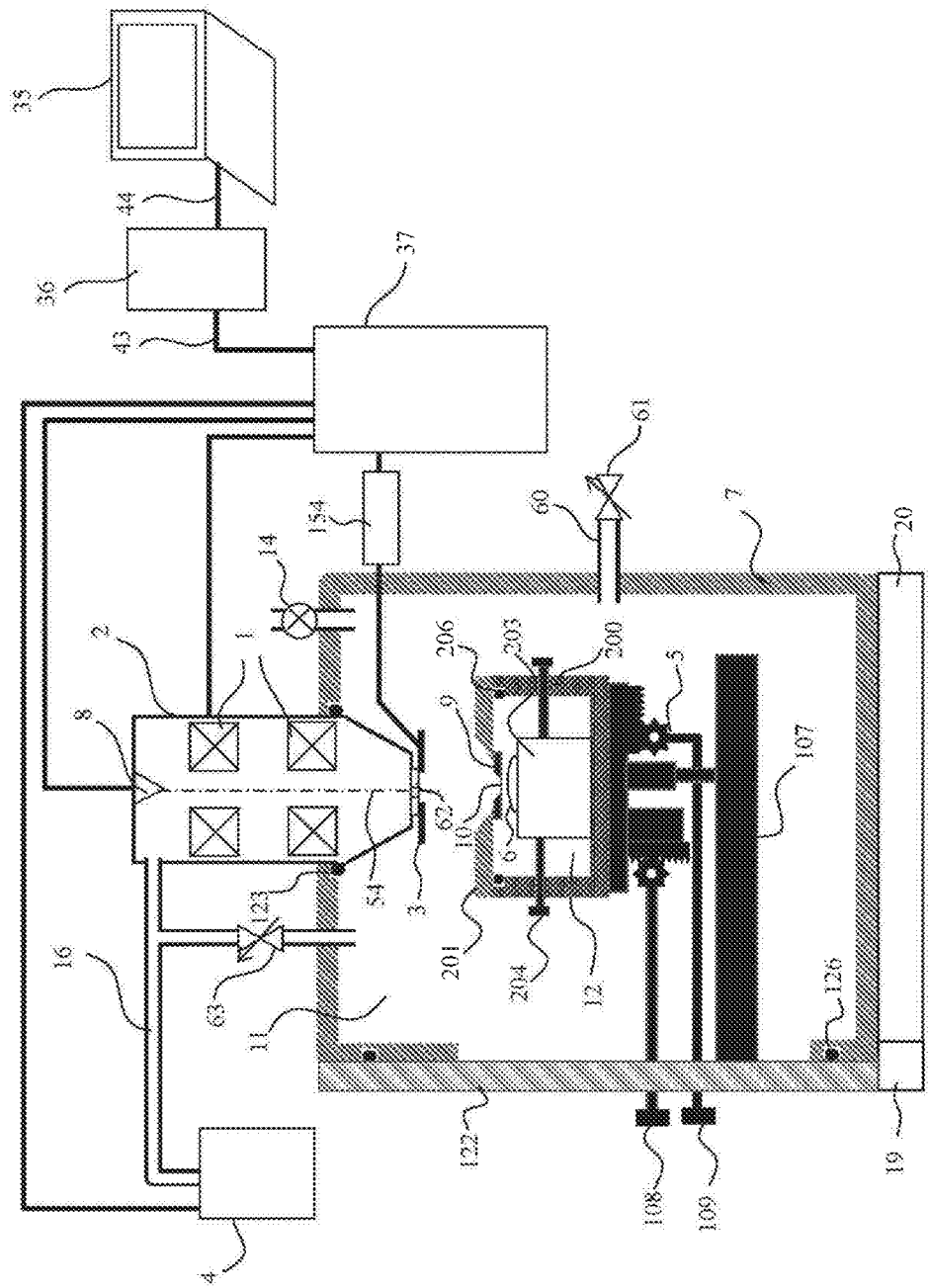
FIG. 8 is a view of the overall configuration of a charged particle microscope according to Example 5.

FIG. 8 shows the state where a specimen storage container is arranged inside the charged particle microscope apparatus. The specimen storage container is made up mainly of a storage container 200, a cover 201, a specimen stage 203 having a drive mechanism for changing the position of the specimen 6, a plurality of operation units 204 for moving the specimen stage 203 from outside the specimen storage container, the isolation film 10 passing or transmitting charged particle beams, and the foundation 9 holding the isolation film 10. The specimen 6 is placed on a specimen platform and stored together with this specimen platform inside the storage container 200, which is a closed space. In order to hold the state where the gas types and air pressures outside and inside the specimen storage container are separated from each other, a vacuum sealing member 206 such as O-ring or packing is provided between the cover 201 and the storage container 200. The underside of the specimen stage 203 and the bottom surface of the storage container 200 are fixed together with a screw or the like, not shown.

Since the specimen 6 and the isolation film 10 are not in contact with each other and the specimen can be moved independently of the isolation film 10 in a direction parallel to the isolation film 10, observation of the specimen over a very broad range (at least a greater range than the area of the isolation film) is possible. Also, since the specimen and the isolation film are not in contact with each other, the isolation film no longer needs to be replaced every time the specimen is replaced.

On the underside (bottom side) of the specimen storage container, a joint part (not illustrated) for arrangement on the specimen stage inside the charged particle beam apparatus, described below, is provided. The joint part may be convex or concave, or may be in a different shape. By having a joint part 209 engaged with a corresponding part of the specimen stage, the specimen storage container is fixed onto the specimen stage.

The stage 5 in the charged particle beam microscope has an XY drive mechanism for an in-plane direction and a Z-axis drive mechanism for a height direction. The support plate 107 is attached in such a way as to be directed toward the surface opposite the cover member 122 and to extend toward the inside of the chassis 7. Support shafts extend from the Z-axis drive mechanism and the XY drive mechanism, respectively, and are connected to the operation knob 108 and the operation knob 109, respectively, provided on the cover member 122. The user of the apparatus can adjust the position of the specimen storage container in relation to the charged particle optical lens barrel by operating these operation knobs. Here, a position adjustment mechanism is provided inside the specimen storage container as well, as described above, and this position adjustment mechanism and the stage are movable independently of each other. The position adjustment mechanism inside the specimen storage container is used for the positioning between the specimen and the isolation film. The stage is used for the positioning between the charged particle optical lens barrel and the specimen storage container.

As described in Example 1, the area of the isolation film is very small due to the requirement of the isolation film having to maintain the pressure difference between atmospheric pressure and vacuum. In this example, since the specimen can be freely moved independently of the isolation film while checking the specimen position with the optical microscope, as in the technique described in Example 1, the field-of-view search operation can be carried out easily. Particularly, since this field-of-view work can be carried out with a local atmosphere maintained, the convenience for the user is significantly improved.

This apparatus, too, has the inlet port 60 for turning the inside of the chassis 7 into a low vacuum, as in Example 1. In the case of this example, the inside of the specimen storage container is a local non-vacuum, and the inside of the chassis 7 as a specimen chamber is a vacuum environment. In this example, unlike Examples 1 and 3, no particular chassis for generating a low vacuum environment on the surface on the side of the charged particle source, of the isolation film, is provided. Thus, when introducing the specimen storage container into the chassis 7 to carry out observation, the inside of the chassis 7 is maintained in a low vacuum. By doing so, a circumstance similar to that in Example 1 can be provided in consideration of the pressures inside and outside the isolation film 10, and the attachment of contamination to the isolation film can be reduced, as in the foregoing examples.

In the case of this example, when the specimen storage container is not used, observation can be carried out as a so-called ordinary SEM. When the specimen storage container is used, a low vacuum environment is provided in the chassis 7 by the needle valve 61 and contamination on the isolation film 10 is thus restrained. When the specimen storage container is not used, the inside the chassis 7 is switched from a low vacuum to a high vacuum by the needle valve 61, as an ordinary SEM. Also, the degree of vacuum inside the chassis 7 in this example can be freely controlled within a range from a low vacuum to a high vacuum. In a common low-vacuum scanning electron microscope, the degree of vacuum in the specimen chamber can be controlled to an arbitrary pressure ranging from a low vacuum to a high vacuum. Therefore, in the case of this example, the space in contact with the vacuum side surface of the isolation film can be set in a low vacuum state, utilizing the specimen chamber of the conventional scanning electron microscope, without newly installing a chassis. In this example, a specimen storage container mode in which the inside of the chassis 7 is a low vacuum and a SEM mode in which the inside of the chassis 7 is a high vacuum may be provided, and an interface which enables the user to give an instruction to select from these modes may be shown on the display of the computer 35. In response to the user's instruction, the controllers 36, 37 control the flow rate adjusting unit such as the needle valve 61 to adjust the degree of vacuum inside the chassis 7. As a matter of course, the user him/herself may directly adjust the flow rate adjusting unit and thus adjust the degree of vacuum inside the chassis 7, without using the computer 35 and the controllers.

Example 6

Figure 9:
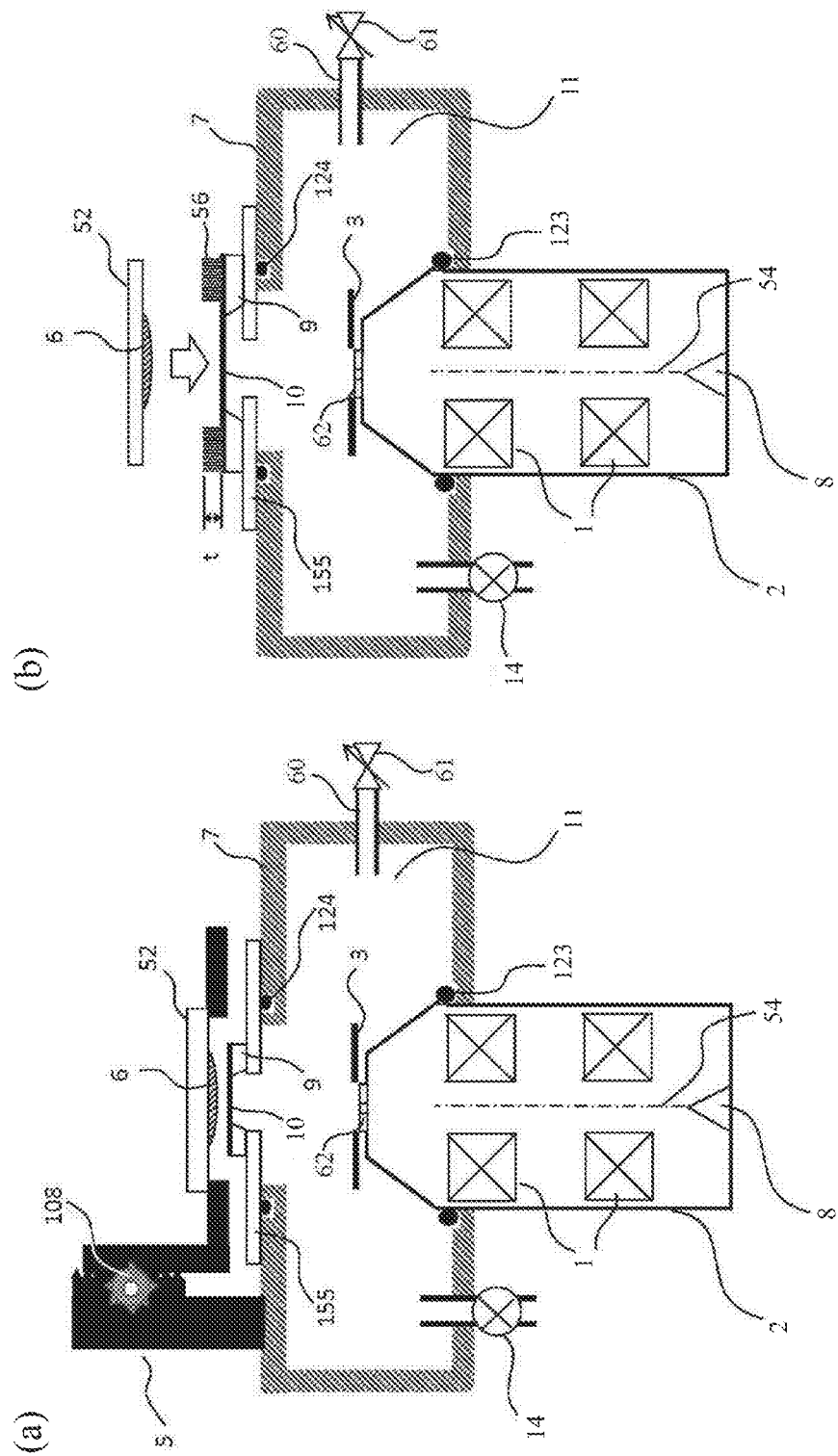
FIG. 9 is a view of the overall configuration of a charged particle microscope according to Example 6.

In this example, a configuration in which the charged particle optical lens barrel 2 is situated below the isolation film 10, which is a modification of Example 1, will be described. FIG. 9 shows a view of the configuration of the charged particle microscope in this example. The vacuum pump, the control system and the like are omitted from the illustration. Also, it is assumed that the chassis 7 as a vacuum chamber and the charged particle optical lens barrel 2 are supported by a pillar, support or the like to the apparatus installation surface. The operations and functions of each component, or additional components added to each component are substantially similar to those in the foregoing examples and therefore the detailed description thereof is omitted.

As shown in FIG. 9(a), in this apparatus, the specimen stage 5 which brings the specimen 6 closer to the isolation film 10 is provided. In this apparatus configuration in this example, the specimen surface on the underside of the specimen 6 in the illustration is to be observed. In other words, in the apparatus configuration in this example, the upper side of the apparatus is opened as an atmospheric pressure space. In this case, the distance between the isolation film and the specimen can be adjusted by the specimen stage 5.

As shown in FIG. 9(b), the specimen 6 may be mounted directly on the side of the isolation film 10 (arrow in the illustration). In this case, the specimen stage 5 is not necessarily required. To bring the isolation film and the specimen 6 closer to each other, a contact prevention member 56, such as a thin film deposited with a prescribed thickness or a removable foil member, is used between the isolation film 10 and the specimen 6. In this case, the contact prevention member 56 is equivalent to a distance adjustment mechanism for adjusting the distance between the isolation film and the specimen. The provision of the contact prevention member 56 enables the user to arrange the specimen 6 with a sense of relief. A plurality of contact prevention members 56 with various known thicknesses may be prepared as well. First, the contact prevention member 56 with a thickness t1 is arranged on the foundation 9. Next, the specimen 6 is mounted. Subsequently, the specimen is observed, and a contact prevention member with a thickness t2 which is smaller than t1 is substituted, if necessary. Thus, it is possible to carry out observation without causing damage to the isolation film 10 and the specimen 6 due to contact.

This apparatus, too, has the inlet port 60 for turning the inside of the chassis 7 into a low vacuum, and the needle valve 61 as a flow rate adjusting unit, as in Example 1. The configurations related to the inlet port 60 and the needle valve 61 are similar to those in Example 1 and therefore the detailed description thereof is omitted.

Example 7

In the foregoing examples, the apparatus and method for charged particle microscope observation with the isolation film 10 and the specimen 6 arranged in the atmosphere in a non-contact state are described. In this example, an apparatus for microscope observation of a specimen arranged in an atmospheric pressure atmosphere in the state where the isolation film and the specimen are in contact with each other will be described.

Figure 10:
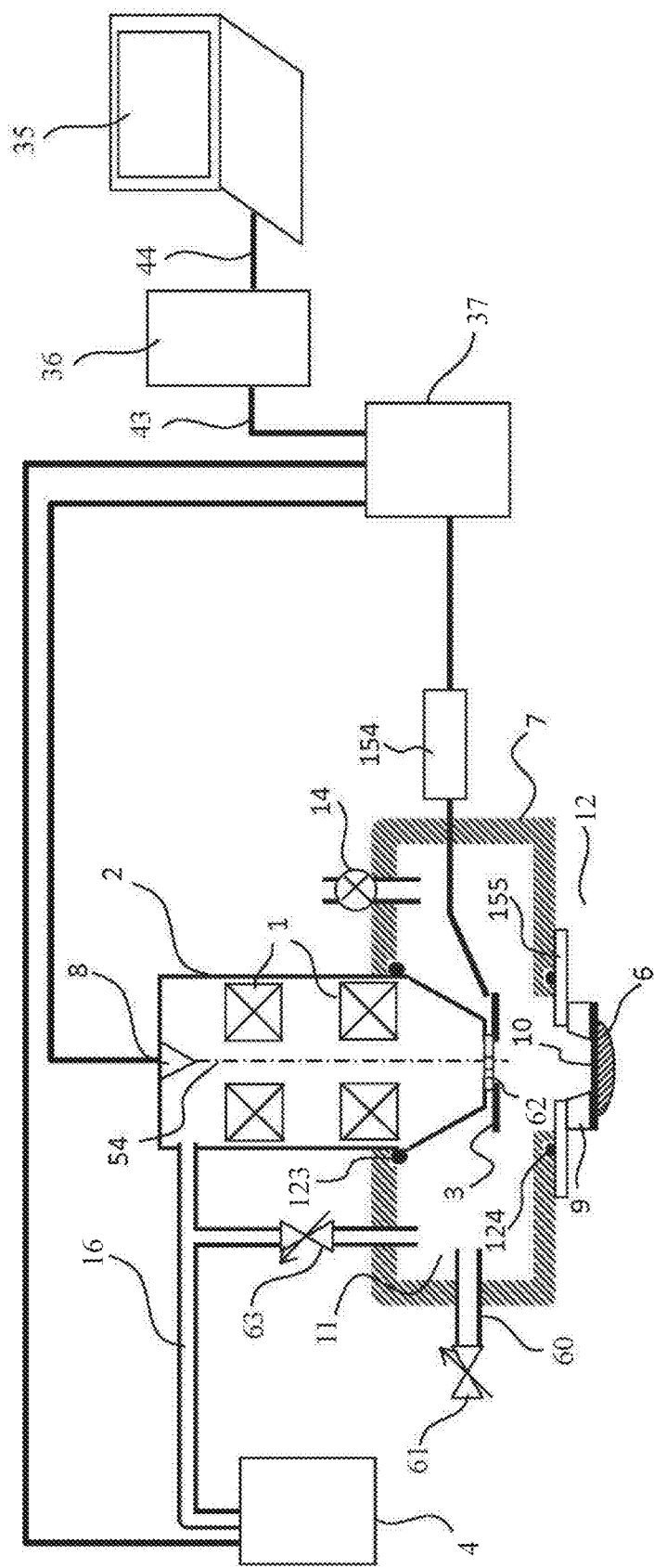
FIG. 10 is a view of the overall configuration of a charged particle microscope according to Example 7.

FIG. 10 shows the charged particle apparatus in this example. It is assumed that the charged particle optical lens barrel 2 and the chassis 7 are supported by a pillar or foundation, not illustrated. Also, a configuration in which the charged particle optical lens barrel is situated below the isolation film 10 as shown in FIG. 9 may be employed. The configuration in this example is the same as Example 1 except that the specimen 6 is in contact with the isolation film 10. The case where the specimen is brought in contact with the isolation film in the apparatus configuration where an attachment is mounted on a common charged particle microscope apparatus as shown in FIGS. 6 and 7 described in Examples 2 and 3 is also included in this example. In the case of this configuration, charged particle microscope observation can be carried out after mounting the specimen 6 on the isolation film holding member 155, bringing the isolation film holding member 155 in contact with the chassis 7, and then turning the first space 11 into a vacuum. In FIG. 10, the chassis 7 is provided in the form of a low vacuum chamber below the charged particle optical lens barrel 2. However, in the case where the inside of the charged particle optical lens barrel 2 is divided into a plurality of chambers and where the air pressure can be maintained in each chamber, the chamber on the nearest side to the specimen may be set in a low vacuum state, and the isolation film 10 holding the specimen, or the isolation film holding member 155 holding the isolation film may be arranged directly at the primary electron beam emission port of the charged particle optical lens barrel 2.

Thus, the surface of the isolation film opposite to the surface in contact with the specimen contacts the low vacuum atmosphere and therefore the attachment of contamination to the isolation film can be reduced, as described in Example 1. Particularly in the configuration in this example, since the specimen is directly in contact with the isolation film, the position of the isolation film holding member 155 is often fine-tuned in order to shift the observation position, and the isolation film tends to be damaged by vibration or impact at that time. Also, if the isolation film is damaged, there is a risk that the specimen is scattered inside the charged particle optical lens barrel, causing the charged particle beam apparatus itself to malfunction. Therefore, it is particularly important to reduce the contamination and thus prevent stress concentration on the isolation film, as described above.

Figure 11:
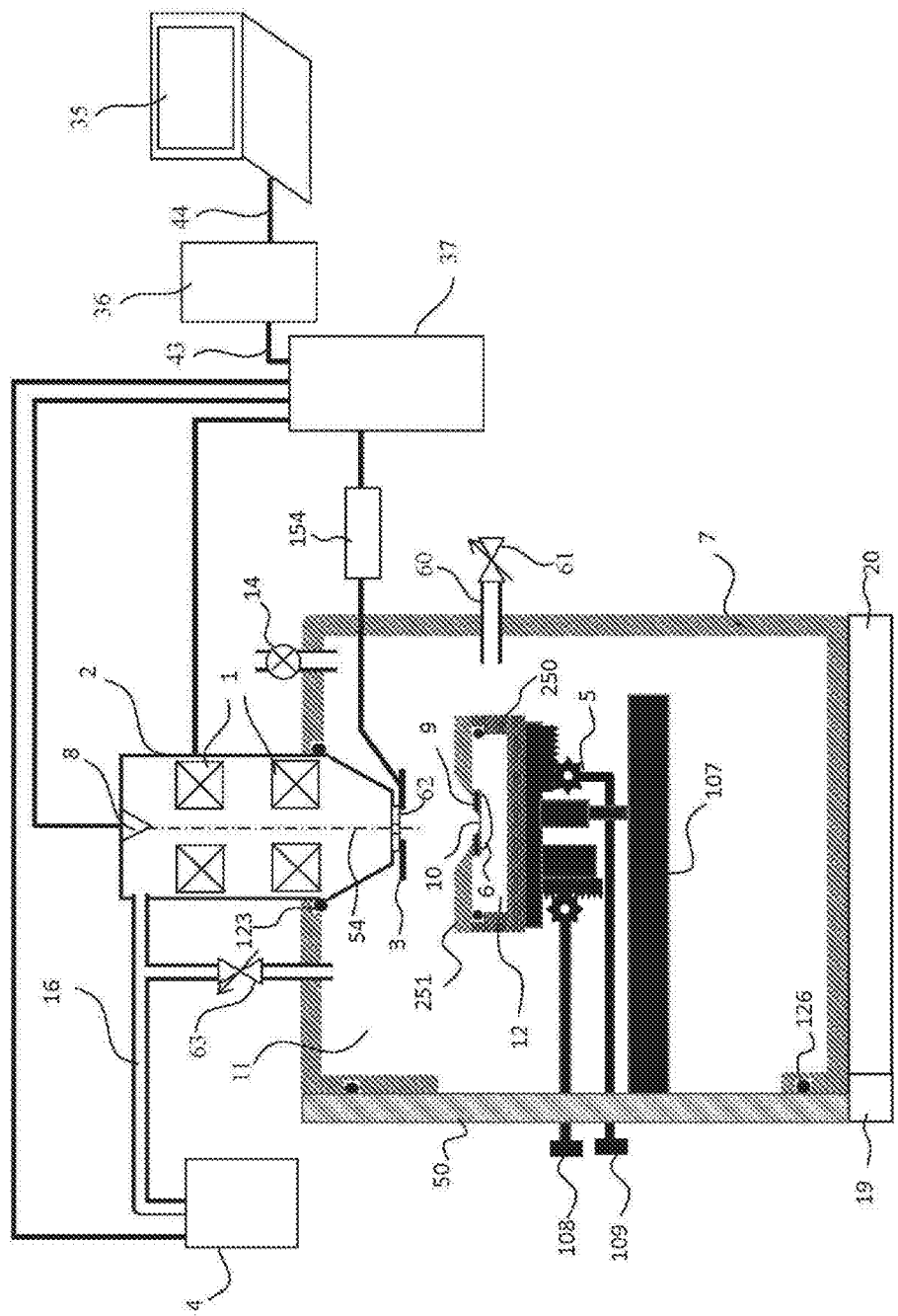
FIG. 11 is a view of the overall configuration of a modification of the charged particle microscope according to Example 7.

As a next example, another charged particle microscope apparatus in which the isolation film and the specimen are brought in contact with each other for observation will be described with reference to FIG. 11. In this configuration, a container 250 capable of containing the specimen 6 in the state of the atmospheric or a predetermined gas atmosphere is arranged on the specimen stage 5 in the charged particle apparatus. In this case, the specimen 6 is in contact with the isolation film 10. Outside the charged particle microscope apparatus, the specimen 6 is mounted on the isolation film 10 provided on a cover 251 of the container 250, and the cover 251 and the container 250 are fixed together with a screw or the like, not illustrated. Next, the container 250 containing the specimen is introduced into the charged current microscope apparatus and charged particle microscope observation is carried out. Charged particle beams emitted from the charged particle source 8 travel through several optical lenses 1, then pass through the vacuum space 11, travel through the isolation film 10 and reach the specimen 6.

This apparatus, too, has the inlet port 60 to turn the inside of the chassis 7 into a low vacuum, as in Example 1, and the inside of the chassis 7 is turned into a low vacuum state at the time of observation of the specimen. The configuration related to the inlet port 60 is similar to that in Example 5 and therefore the detailed description thereof is omitted. As in Example 5, since the degree of vacuum in the specimen chamber in a common low-vacuum scanning electron microscope can be controlled to an arbitrary pressure ranging from a low vacuum to a high vacuum, in the case of this example, the space in contact with the vacuum side surface of the isolation film can be set in a low vacuum state, utilizing the specimen chamber of the conventional scanning electron microscope, without newly installing a chassis.

Also, the invention is not limited to the above examples and includes various modifications. For example, the above examples are described in detail in order to explain the invention intelligibly and are not necessarily limited to having all the described configurations. Also, a part of the configuration in one example can be replaced with the configuration of another example, and the configuration in one example can be added to the configuration in another example. Also, with respect to a part of the configuration in each example, addition, deletion and replacement with another configuration can be made. Moreover, a part or the entirety of each of the above configurations, functions, processors, processing units and the like may be implemented in the form of hardware by designing on an integrated circuit, for example. Also, each of the above configurations, functions and the like may be implemented in the form of software by causing a processor to interpret and execute a program which realizes each function.

Information such as programs, tables and files to realize each function can be placed in a recording device such as memory, hard disk or SSD (solid state drive), or in a recording medium such as IC card, SD card or optical disk.

Also, control lines and information lines that are considered to be necessary for the description are shown, and not all the control lines and information lines of the product are necessarily shown. In practice, almost all the configurations may be considered to be connected to each other.

REFERENCE SIGNS LIST

1: optical lens, 2: charged particle optical lens barrel, 3: detector, 4: vacuum pump, 5: specimen stage, 6: specimen, 7: chassis, 8: charged particle source, 9: foundation, 10: isolation film, 11: first space, 12: second space, 14: leak valve, 15: open side, 16: vacuum pipe, 35: computer, 36: higher-level controller, 37: lower-level controller, 43, 44: communication lines, 52: specimen platform, 52a: center axis, 52b: pin, 53: charged particle beam microscope, 54: optical axis of charged particle beam, 56: contact prevention member, 60: inlet port, 61: needle valve, 62: orifice, 63: needle valve, 64: valve, 100: gas supply pipe, 101: gas control valve, 102: connecting part, 103: gas cylinder or vacuum pump, 104: pressure control valve, 107: support plate, 108, 109: operation knob, 121: second chassis, 122: cover member, 123, 124, 126: vacuum sealing member, 131: main body part, 132: joint part, 154: signal amplifier, 155: isolation film holding member, 160: optical microscope, 160a: optical microscope optical axis, 161: specimen mounting platform, 162: positioning structure, 163: specimen mounting platform, 164: positioning structure, 165: moving mechanism, 165a, 165b: knob, 200: storage container, 201: cover, 202: specimen platform, 203: specimen stage, 204: operation unit, 250: container, 251: cover, 270: base

The invention claimed is:

1. A scanning electron microscope to irradiate, with a primary electron beam, a specimen placed in a space of an atmospheric pressure atmosphere and to thereby acquire an image of the specimen on the basis of a signal generated from the specimen, the scanning electron microscope comprising:
an electron optical lens barrel which includes an electron source, and that irradiates the specimen with the primary electron beam, the electron optical lens barrel being maintained in a first vacuum state;
a chassis which is bonded to the electron optical lens barrel, the chassis having an inside maintained in a second vacuum state which is lower than the first vacuum state maintained inside of the electron optical lens barrel at least during the irradiation of the specimen with the primary electron beam; and
an isolation film which separates the atmospheric pressure atmosphere in which the specimen is placed and the inside of the chassis, the isolation film transmits the primary electron beam therethrough, and the isolation film is attached to the chassis;
a specimen platform to support the specimen in the space of an atmospheric pressure atmosphere, the specimen platform and the specimen supported on the specimen platform being positioned below, separate from the isolation film and out of contact with the isolation film; and
a control unit which performs control such that the air pressure inside the chassis is changed to 0.1 Pa or above and 1000 Pa or below when in a field-of-view search mode in which an observation target position of the specimen is decided, and changed to 0.1 Pa or below when in an image acquisition mode for the specimen.

2. The scanning electron microscope according to claim 1, wherein
an air pressure inside the chassis is set to 0.1 Pa or above and 1000 Pa or below at least during the irradiation with the primary electron beam.

3. The scanning electron microscope according to claim 1, wherein
contamination on the isolation film is decomposed by irradiating the isolation film with the primary electron beam.

4. The scanning electron microscope according to claim 1, further comprising:
an orifice which holds the second vacuum state below the first vacuum state, the orifice being positioned on the electron optical lens barrel.

5. The scanning electron microscope according to claim 1, wherein
the chassis includes a port for introducing a gas into the chassis, and a flow rate adjustment member which controls a flow rate of the gas.

6. A scanning electron microscope which irradiates, with a primary electron beam, a specimen placed in a space of an atmospheric pressure atmosphere and thereby acquires an image of the specimen on the basis of a signal generated from the specimen, the scanning electron microscope comprising:
an electron optical lens barrel which includes an electron source and irradiates the specimen with the primary electron beam;
a chassis which is directly bonded to an inside of the electron optical lens barrel and has an inside turning into a lower vacuum state than the inside of the electron optical lens barrel at least during the irradiation with the primary electron beam and wherein an air pressure in the chassis is changeable;
an isolation film which isolates the space of the atmospheric pressure atmosphere where the specimen is placed and the inside of the chassis from each other, and transmits the primary electron beam; and,
a control unit which performs such control that the air pressure inside the chassis is 0.1 Pa or above and 1000 Pa or below when in a field-of-view search mode in which an observation target position of the specimen is decided, and 0.1 Pa or below when in an image acquisition mode for the specimen.

7. An image generation method in which a specimen placed in a space of an atmospheric pressure atmosphere is irradiated with a primary electron beam, thereby acquiring an image of the specimen on the basis of a signal generated from the specimen, the method comprising:
- emitting the primary electron beam, generated by an electron source, from an electron optical lens barrel maintained in a first vacuum state;
- passing the primary electron beam emitted from the electron optical lens barrel through an inside of a chassis that is maintained in a second vacuum state lower than the first vacuum state inside of the electron optical lens barrel;
- providing a specimen platform and supporting the specimen to be irradiated by the primary electron beam on the specimen platform;
- positioning the specimen platform and supported specimen in the space of the atmospheric pressure atmosphere and below the chassis in a direction of travel of the primary electron beam;
- providing an isolation film attached to the chassis which separates the inside of the chassis and the space of atmospheric pressure atmosphere where the specimen platform and specimen are located;
- spacing the isolation film apart from and separate from the specimen platform and the specimen and out of contact with the specimen supported on the specimen platform;
- transmitting the primary electron beam through the inside of the chassis, and through the isolation film which separates the space of the atmospheric pressure atmosphere in which the specimen is placed and the inside of the chassis;
- irradiating the specimen with the primary electron beam transmitted through the isolation film; and
- performing a field-of-view search for deciding an observation target position of the specimen in a state where the air pressure inside the chassis is 0.1 Pa or above and 1000 Pa or below, and
- subsequently, acquiring an image of the specimen in a state where the air pressure inside the chassis is 0.1 Pa or below.

8. The image generation method according to claim 7, wherein
- contamination on the isolation film is decomposed by irradiating the isolation film with the primary electron beam.

9. An image generation method in which a specimen placed in a space of an atmospheric pressure atmosphere is irradiated with a primary electron beam, thereby acquiring an image of the specimen on the basis of a signal generated from the specimen, the method comprising:
- emitting the primary electron beam, generated by an electron source, from an electron optical lens barrel;
- passing the primary electron beam emitted from the electron optical lens barrel, through an inside of a chassis that is in a lower vacuum state than the inside of the electron optical lens barrel;
- transmitting the primary electron beam passed through the inside of the chassis in which the air pressure inside the chassis is changeable, through an isolation film which isolates the space of the atmospheric pressure atmosphere where the specimen is placed and the inside of the chassis, from each other;
- irradiating the specimen with the primary electron beam transmitted through the isolation film;
- performing a field-of-view search for deciding an observation target position of the specimen in a state where the air pressure inside the chassis is 0.1 Pa or above and 1000 Pa or below, and
- subsequently, acquiring an image of the specimen in a state where the air pressure inside the chassis is 0.1 Pa or below.

* * * * *